(12) United States Patent
Andrews et al.

(10) Patent No.: US 10,903,265 B2
(45) Date of Patent: Jan. 26, 2021

(54) PIXELATED-LED CHIPS AND CHIP ARRAY DEVICES, AND FABRICATION METHODS

(71) Applicant: Cree, Inc., Durham, NC (US)

(72) Inventors: Peter Scott Andrews, Durham, NC (US); Steven Wuester, Wake Forest, NC (US)

(73) Assignee: CREE, INC., Durham, NC (US)

( * ) Notice: Subject to any disclaimer, the term of this patent is extended or adjusted under 35 U.S.C. 154(b) by 49 days.

(21) Appl. No.: 16/229,986

(22) Filed: Dec. 21, 2018

(65) Prior Publication Data

US 2020/0203419 A1 Jun. 25, 2020

(51) Int. Cl.
*H01L 29/18* (2006.01)
*H01L 27/15* (2006.01)
(Continued)

(52) U.S. Cl.
CPC .............. *H01L 27/156* (2013.01); *F21K 9/90* (2013.01); *H01L 33/007* (2013.01); *H01L 33/32* (2013.01);
(Continued)

(58) Field of Classification Search
CPC ... H01L 25/0753; H01L 25/50; H01L 27/156; H01L 33/007; H01L 33/32; H01L 33/44;
(Continued)

(56) References Cited

U.S. PATENT DOCUMENTS 4,319,070 A  3/1982 Imai et al.
5,955,747 A  9/1999 Ogihara et al.
(Continued)

FOREIGN PATENT DOCUMENTS

CN  101894851 A  11/2010
EP  2320483 A1  5/2011
(Continued)

OTHER PUBLICATIONS

Non-Final Office Action for U.S. Appl. No. 15/399,729, dated Mar. 27, 2019, 9 pages.
(Continued)

*Primary Examiner* — Brook Kebede
(74) *Attorney, Agent, or Firm* — Withrow & Terranova, P.L.L.C.; Vincent K. Gustafson

(57) ABSTRACT

Pixelated-LED chips and related methods are disclosed. A pixelated-LED chip includes an active layer with independently electrically accessible active layer portions arranged on or over a light-transmissive substrate. The active layer portions are configured to illuminate different light-transmissive substrate portions to form pixels. Various enhancements may beneficially provide increased contrast (i.e., reduced cross-talk between pixels) and/or promote inter-pixel illumination homogeneity, without unduly restricting light utilization efficiency. In some aspects, an underfill material with improved surface coverage is provided between adjacent pixels of a pixelated-LED chip. The underfill material may be arranged to cover all lateral surfaces between the adjacent pixels. In some aspects, discontinuous substrate portions are formed before application of underfill materials. In some aspects, a wetting layer is provided to improve wicking or flow of underfill materials during various fabrication steps. Other technical benefits may additionally or alternatively be achieved.

30 Claims, 18 Drawing Sheets

(51) Int. Cl.

| | | |
|---|---|---|
| *F21K 9/90* | (2016.01) | |
| *H01L 33/00* | (2010.01) | |
| *H01L 33/32* | (2010.01) | |
| *H01L 33/44* | (2010.01) | |
| *H01L 33/62* | (2010.01) | |
| *F21Y 115/10* | (2016.01) | |

(52) U.S. Cl.
CPC .............. *H01L 33/44* (2013.01); *H01L 33/62* (2013.01); *F21Y 2115/10* (2016.08); *H01L 2933/0016* (2013.01); *H01L 2933/0025* (2013.01); *H01L 2933/0066* (2013.01)

(58) Field of Classification Search
CPC ....... H01L 33/46; H01L 33/50; H01L 33/502; H01L 33/504; H01L 33/58; H01L 33/60; H01L 33/62; F21K 9/90
USPC .............................................. 257/88, 98–100
See application file for complete search history.

(56) References Cited

U.S. PATENT DOCUMENTS

| | | |
|---|---|---|
| 6,657,236 B1 | 12/2003 | Thibeault et al. |
| 6,747,298 B2 | 6/2004 | Slater, Jr. et al. |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,829,906 B2 | 11/2010 | Donofrio |
| 8,716,724 B2 | 5/2014 | von Malm et al. |
| 8,835,959 B2 | 9/2014 | Nakamura et al. |
| 8,940,561 B2 | 1/2015 | Donofrio et al. |
| 8,963,121 B2 | 2/2015 | Odnoblyudov et al. |
| 8,969,897 B2 | 3/2015 | Choi |
| 8,981,395 B2 | 3/2015 | Choi et al. |
| 9,048,368 B2 | 6/2015 | Jeong |
| 9,099,575 B2 | 8/2015 | Medendorp, Jr. et al. |
| 9,123,864 B2 | 9/2015 | Tomonari et al. |
| 9,129,977 B2 | 9/2015 | Marchand et al. |
| 9,130,127 B2 | 9/2015 | Katsuno et al. |
| 9,130,128 B2 | 9/2015 | Shinohara |
| 9,130,137 B2 | 9/2015 | Lin et al. |
| 9,136,432 B2 | 9/2015 | Yun et al. |
| 9,136,433 B2 | 9/2015 | Park et al. |
| 9,142,725 B1 | 9/2015 | Suzuki |
| 9,153,750 B2 | 10/2015 | Seo et al. |
| 9,159,894 B2 | 10/2015 | Cho et al. |
| 9,166,107 B2 | 10/2015 | Park |
| 9,166,108 B2 | 10/2015 | Unosawa |
| 9,166,110 B2 | 10/2015 | Aihara |
| 9,166,111 B2 | 10/2015 | Matsui et al. |
| 9,171,882 B2 | 10/2015 | Akimoto et al. |
| 9,172,002 B2 | 10/2015 | Wang et al. |
| 9,172,021 B2 | 10/2015 | Sugizaki et al. |
| 9,178,121 B2 | 11/2015 | Edmond et al. |
| 9,196,653 B2 | 11/2015 | Leatherdale et al. |
| 9,209,223 B2 | 12/2015 | Lee et al. |
| 9,219,196 B2 | 12/2015 | Seo et al. |
| 9,219,200 B2 | 12/2015 | Erchak et al. |
| 9,231,037 B2 | 1/2016 | Shimayama |
| 9,236,526 B2 | 1/2016 | Choi et al. |
| 9,240,433 B2 | 1/2016 | Kim et al. |
| 9,252,345 B2 | 2/2016 | Cho et al. |
| 9,263,643 B2 | 2/2016 | Huang et al. |
| 9,263,652 B2 | 2/2016 | Yoon et al. |
| 9,269,858 B2 | 2/2016 | Schubert et al. |
| 9,277,618 B2 | 3/2016 | Odnoblyudov et al. |
| 9,281,448 B2 | 3/2016 | Choi et al. |
| 9,281,449 B2 | 3/2016 | Kim et al. |
| 9,287,457 B2 | 3/2016 | Jeong et al. |
| 9,293,664 B2 | 3/2016 | Seo et al. |
| 9,293,674 B2 | 3/2016 | Kususe et al. |
| 9,293,675 B2 | 3/2016 | Yang et al. |
| 9,299,889 B2 | 3/2016 | Katsuno et al. |
| 9,299,893 B2 | 3/2016 | Chen et al. |
| 9,300,111 B2 | 3/2016 | Lee et al. |
| 9,318,529 B2 | 4/2016 | Jang et al. |
| 9,324,765 B2 | 4/2016 | An |
| 9,337,175 B2 | 5/2016 | Seo et al. |
| 9,362,335 B2 | 6/2016 | von Maim |
| 9,362,337 B1 | 6/2016 | Wu et al. |
| 9,373,756 B2 | 6/2016 | Lee et al. |
| 9,653,643 B2 | 5/2017 | Bergmann et al. |
| 9,729,676 B2 | 8/2017 | Kobayashi et al. |
| 9,748,309 B2 | 8/2017 | von Malm |
| 9,754,926 B2 | 9/2017 | Donofrio et al. |
| 9,831,220 B2 | 11/2017 | Donofrio et al. |
| 10,317,787 B2 | 6/2019 | Graves et al. |
| 2003/0015959 A1 | 1/2003 | Tomoda et al. |
| 2005/0023550 A1 | 2/2005 | Eliashevich et al. |
| 2005/0253492 A1 | 11/2005 | Besshi et al. |
| 2006/0281203 A1 | 12/2006 | Epler et al. |
| 2008/0179611 A1 | 7/2008 | Chitnis et al. |
| 2008/0211416 A1 | 9/2008 | Negley et al. |
| 2008/0290351 A1 | 11/2008 | Ajiki et al. |
| 2009/0179843 A1 | 7/2009 | Ackermann et al. |
| 2009/0241390 A1 | 10/2009 | Roberts |
| 2010/0015574 A1 | 1/2010 | Van der Zel et al. |
| 2010/0051785 A1 | 3/2010 | Dai et al. |
| 2010/0123386 A1 | 5/2010 | Chen |
| 2010/0163900 A1 | 7/2010 | Seo et al. |
| 2011/0049545 A1 | 3/2011 | Basin et al. |
| 2011/0084294 A1 | 4/2011 | Yao |
| 2011/0121732 A1 | 5/2011 | Tsutsumi |
| 2011/0291143 A1* | 12/2011 | Kim ........................ H01L 33/60 257/98 |
| 2011/0294240 A1 | 12/2011 | Kim |
| 2011/0297979 A1 | 12/2011 | Diana et al. |
| 2012/0062135 A1 | 3/2012 | Tamaki et al. |
| 2012/0119237 A1 | 5/2012 | Leatherdale et al. |
| 2012/0205634 A1 | 8/2012 | Ikeda et al. |
| 2012/0236582 A1 | 9/2012 | Waragaya et al. |
| 2012/0268042 A1 | 10/2012 | Shiobara et al. |
| 2013/0264592 A1 | 10/2013 | Bergmann et al. |
| 2014/0070245 A1 | 3/2014 | Haberern et al. |
| 2014/0110730 A1 | 4/2014 | Lee et al. |
| 2014/0361321 A1 | 12/2014 | Saito et al. |
| 2015/0049502 A1 | 2/2015 | Brandl et al. |
| 2015/0207045 A1 | 7/2015 | Wada et al. |
| 2015/0228876 A1 | 8/2015 | Place et al. |
| 2015/0279902 A1 | 10/2015 | Von Malm et al. |
| 2015/0295009 A1 | 10/2015 | Wang et al. |
| 2015/0311407 A1 | 10/2015 | Gootz et al. |
| 2015/0340346 A1 | 11/2015 | Chu et al. |
| 2016/0150614 A1 | 5/2016 | Randolph |
| 2016/0163916 A1 | 6/2016 | Ilievski et al. |
| 2016/0240516 A1 | 8/2016 | Chang |
| 2017/0092820 A1 | 3/2017 | Kim et al. |
| 2017/0098746 A1 | 4/2017 | Bergmann et al. |
| 2017/0135177 A1 | 5/2017 | Wang et al. |
| 2017/0141280 A1 | 5/2017 | Zhong et al. |
| 2017/0148771 A1 | 5/2017 | Cha et al. |
| 2017/0207284 A1 | 7/2017 | Dykaar |
| 2017/0229431 A1 | 8/2017 | Bergmann et al. |
| 2017/0250164 A1 | 8/2017 | Takeya et al. |
| 2017/0271561 A1 | 9/2017 | Bergmann et al. |
| 2017/0287887 A1 | 10/2017 | Takeya et al. |
| 2017/0294417 A1 | 10/2017 | Edmond et al. |
| 2017/0294418 A1* | 10/2017 | Edmond ............... H01L 27/156 |
| 2017/0317251 A1 | 11/2017 | Sweegers et al. |
| 2017/0318636 A1 | 11/2017 | Kums |
| 2017/0358624 A1 | 12/2017 | Takeya et al. |
| 2018/0012949 A1 | 1/2018 | Takeya et al. |
| 2018/0076368 A1 | 3/2018 | Hussell |
| 2018/0145058 A1 | 5/2018 | Meitl et al. |
| 2018/0212108 A1 | 7/2018 | Leirer et al. |
| 2018/0359825 A1 | 12/2018 | Hussell |
| 2019/0044040 A1 | 2/2019 | Andrews |

FOREIGN PATENT DOCUMENTS

| | | | |
|---|---|---|---|
| EP | | 2325883 A2 | 5/2011 |
| EP | | 2393132 A2 | 12/2011 |

(56) References Cited

FOREIGN PATENT DOCUMENTS

| | | |
|---|---|---|
| EP | 3076442 A1 | 10/2016 |
| JP | 2008262993 A | 10/2008 |
| JP | 2013179197 A | 9/2013 |
| JP | 5788046 B2 | 9/2015 |
| KR | 1020130086109 A | 7/2013 |
| WO | 2008062783 A1 | 5/2008 |
| WO | 2015063077 A1 | 5/2015 |
| WO | 2015135839 A1 | 9/2015 |
| WO | 2016188505 A1 | 12/2016 |

OTHER PUBLICATIONS

Notice of Allowance for U.S. Appl. No. 15/401,240, dated Apr. 1, 2019, 8 pages.
Non-Final Office Action for U.S. Appl. No. 16/053,980, dated Jun. 13, 2019, 7 pages.
Examination Report for European Patent Application No. 17721889.8, dated Apr. 26, 2019, 12 pages.
Examination Report for European Patent Application No. 17721889.8, dated Dec. 13, 2019, 5 pages.
International Preliminary Report on Patentability for International Patent Application No. PCT/US2018/045102, dated Feb. 13, 2020, 15 pages.
International Search Report and Written Opinion for International Patent Application No. PCT/IB2019/060455, dated Feb. 7, 2020, 17 pages.
Non-Final Office Action for U.S. Appl. No. 16/414,162, dated Dec. 23, 2019, 10 pages.
Non-Final Office Action for U.S. Appl. No. 15/621,731, dated Dec. 30, 2019, 15 pages.
Non-Final Office Action for U.S. Appl. No. 16/414,162, dated Sep. 13, 2019, 11 pages.
Advisory Action and AFCP 2.0 Decision for U.S. Appl. No. 15/621,731, dated Oct. 9, 2019, 4 pages.
Notice of Allowance for U.S. Appl. No. 16/053,980, dated Oct. 21, 2019, 9 pages.
Non-Final Office Action for U.S. Appl. No. 16/174,584, dated Oct. 21, 2019, 7 pages.
Final Office Action for U.S. Appl. No. 15/621,731, dated Jul. 11, 2019, 15 pages.
Notice of Allowance for U.S. Appl. No. 15/896,805, dated Jun. 21, 2019, 8 pages.
Carey, Julian, "New LED architectures and phosphor technologies lower costs and boost quality (Magazine)," LEDs Magazine, accessed Feb. 17, 2017, http://www.ledsmagazine.com/articles/print/volume-11/issue-7/features/manufacturing/new-led-architectures-and-phosphor-technologies-lower-costs-and-boost-quality.html, published Sep. 4, 2014, PennWell Corporation, 7 pages.
Chong, Wing et al., "1700 pixels per inch (PPI) Passive-Matrix Micro-LED Display Powered by ASIC," IEEE Compound Semiconductor Integrated Circuit Symposium (CSICs), Oct. 19-22, 2014, IEEE, 4 pages.
Dodel, Dr. Kerstin et al., "Capital Markets Day 2015," HELLA KGaA Hueck & Co, Dec. 2, 2015, London, HELLA, pp. 1-89.
Herrnsdorf, Johannes et al., "Active-Matrix GaN Micro Light-Emitting Diode Display With Unprecedented Brightness," IEEE Transactions on Electron Devices, vol. 62, Issue 6, Jun. 2015, IEEE, pp. 1918-1925.
Jiang, H. X. et al., "Nitride micro-LEDs and beyon—a decade progress review," Optics Express, vol. 21, Issue S3, Apr. 22, 2013, OSA, 10 pages.
Non-Final Office Action for U.S. Appl. No. 15/401,240, dated May 26, 2017, 7 pages.
Non-Final Office Action for U.S. Appl. No. 15/401,240, dated Jan. 17, 2018, 8 pages.
Invitation to Pay Additional Fees and Partial Search Report for International Patent Application No. PCT/US2017/026163, dated Aug. 1, 2017, 23 pages.
International Search Report and Written Opinion for International Patent Application No. PCT/US2017/026163, dated Oct. 25, 2017, 30 pages.
Author Unknown, "MBI5026: 16-bit Constant Current LED Sink Driver," Datasheet, Version 1.0, Mar. 2004, Hsinchu, Taiwan, www.DatasheetCatalog.com, Macroblock, Inc., pp. 1-15.
Non-Final Office Action for U.S. Appl. No. 15/399,729, dated Jan. 24, 2018, 12 pages.
Final Office Action for U.S. Appl. No. 15/399,729, dated Jun. 28, 2018, 9 pages.
Final Office Action for U.S. Appl. No. 15/401,240, dated Jun. 26, 2018, 11 pages.
Official Letter for Taiwanese Patent Application No. 106112033, dated Aug. 27, 2018, 19 pages.
Notice of Allowance for U.S. Appl. No. 15/399,729, dated Oct. 23, 2018, 8 pages.
Notice of Allowance for U.S. Appl. No. 15/401,240, dated Oct. 25, 2018, 7 pages.
International Preliminary Report on Patentability for International Patent Application No. PCT/US2017/026163, dated Oct. 25, 2018, 20 pages.
Invitation to Pay Additional Fees and Partial Search Report for International Patent Application No. PCT/US2018/045102, dated Oct. 30, 2018, 14 pages.
Quayle Action for U.S. Appl. No. 15/896,805, mailed Jan. 10, 2019, 5 pages.
Non-Final Office Action for U.S. Appl. No. 15/621,731, dated Dec. 31, 2018, 43 pages.
International Search Report and Written Opinion for International Patent Application No. PCT/US2018/045102, dated Jan. 21, 2019, 23 pages.
Notice of Allowance for U.S. Appl. No. 16/174,584, dated Mar. 23, 2020, 11 pages.
U.S. Appl. No. 16/174,584, filed Oct. 30, 2018.
U.S. Appl. No. 15/896,805, filed Feb. 14, 2018.
U.S. Appl. No. 15/882,103, filed Jan. 29, 2018.
Final Office Action for U.S. Appl. No. 16/414,162, dated Jul. 15, 2020, 11 pages.
Non-Final Office Action for U.S. Appl. No. 15/621,731, dated Jul. 8, 2020, 15 pages.
Notice of Allowance for U.S. Appl. No. 16/414,162, dated Sep. 23, 2020, 8 pages.
Office Action for Korean Patent Application No. 10-2018-7032540, dated Oct. 21, 2020, 23 pages.
Notice of Allowance for U.S. Appl. No. 17/008,544, dated Sep. 29, 2020, 8 pages.
Notice of Reasons for Refusal for Japanese Patent Application No. 2018-553935, dated Nov. 24, 2020, 6 pages.

* cited by examiner

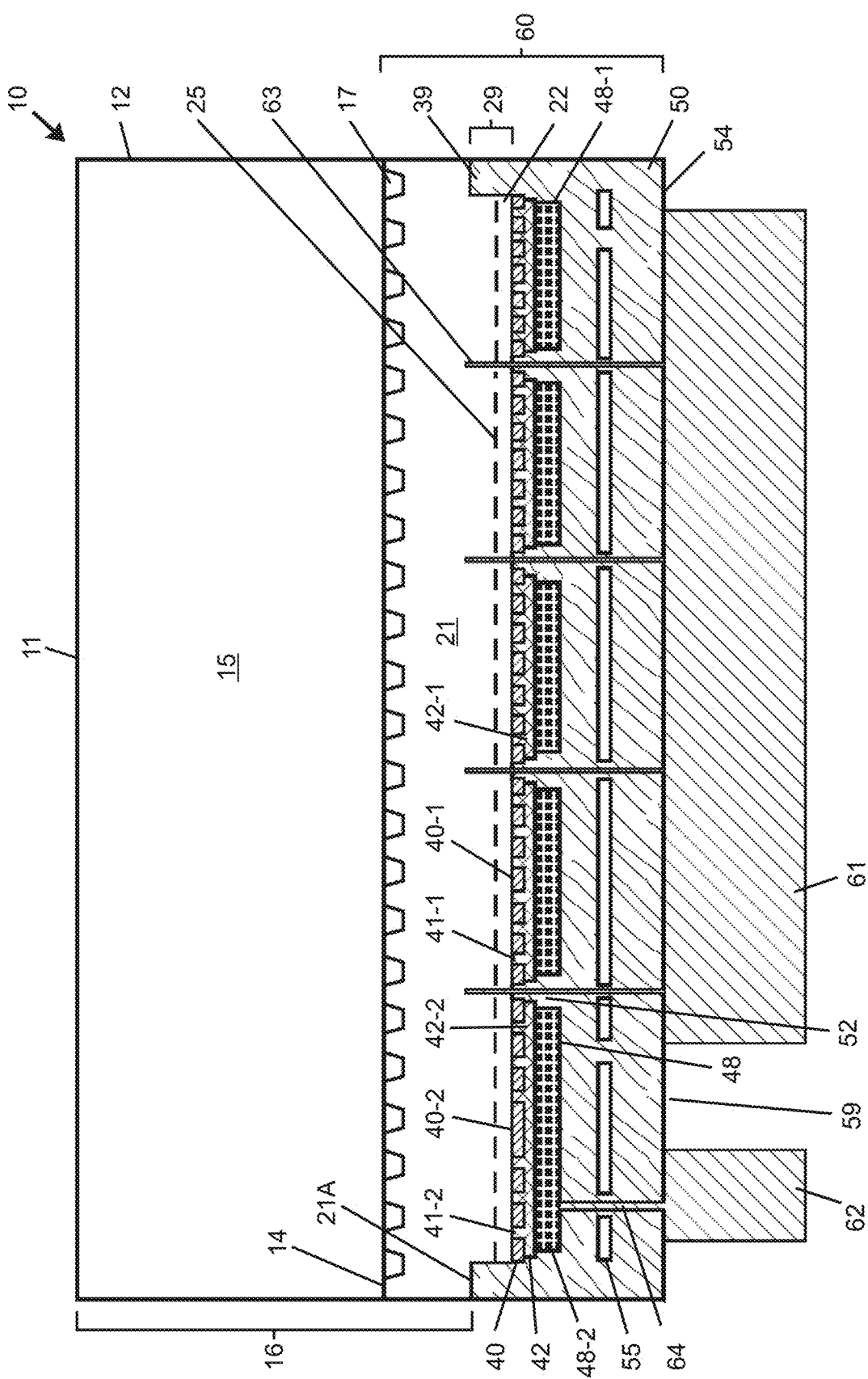
FIG._1

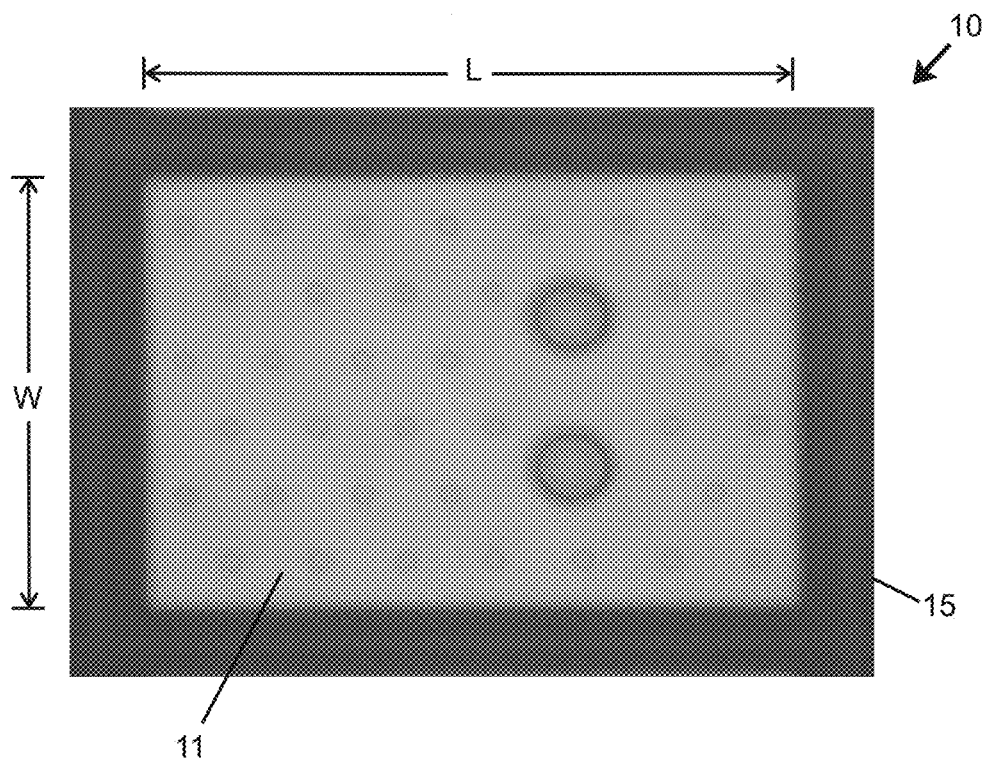
FIG._2A
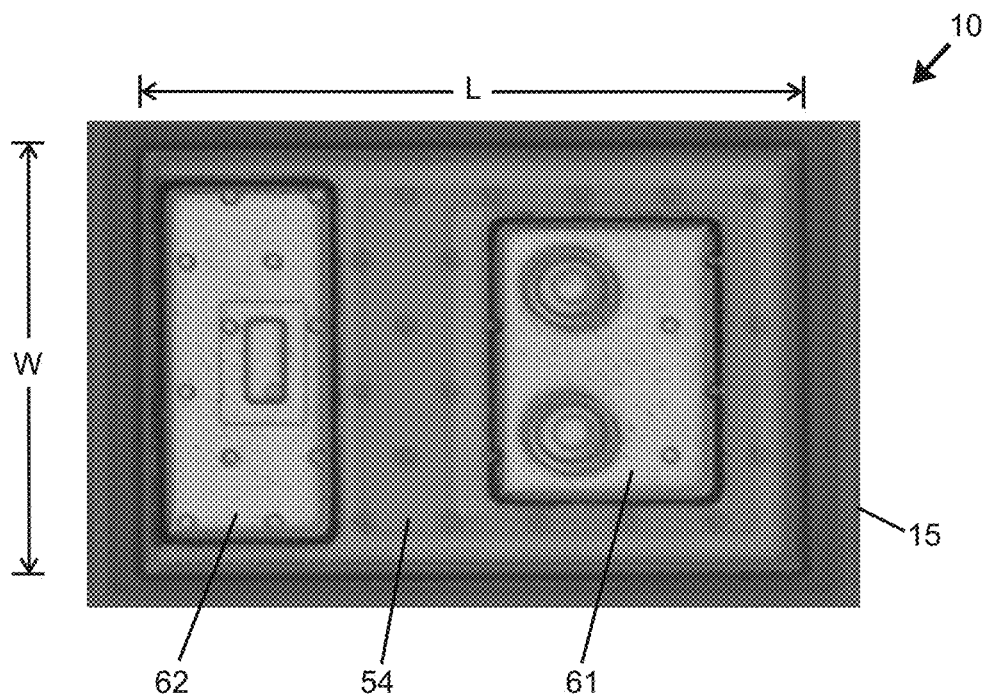
FIG._2B

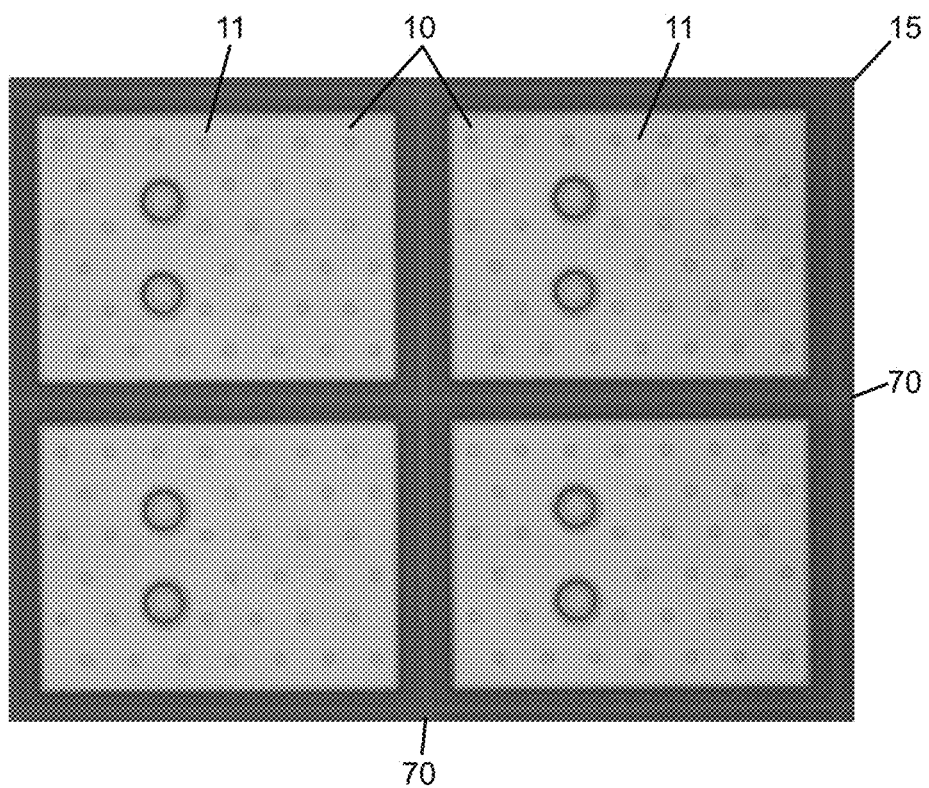
FIG._3A
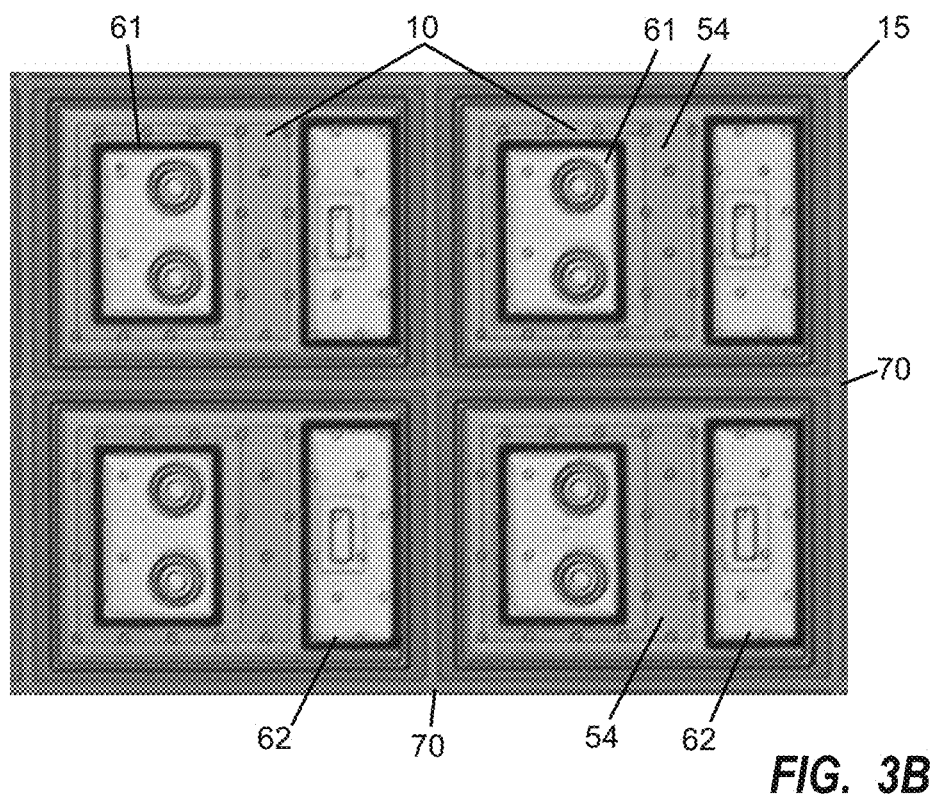
FIG._3B

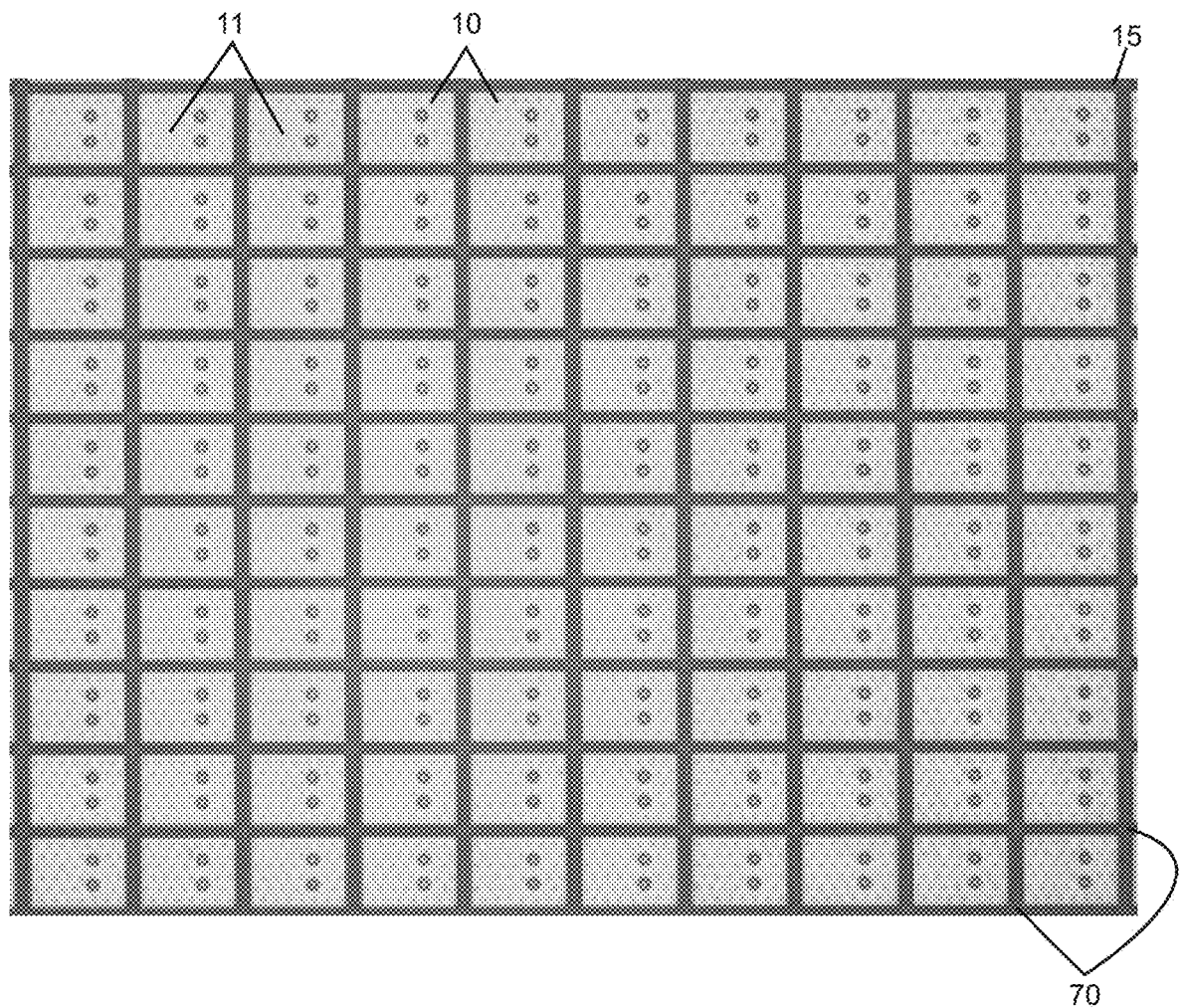
FIG._4A

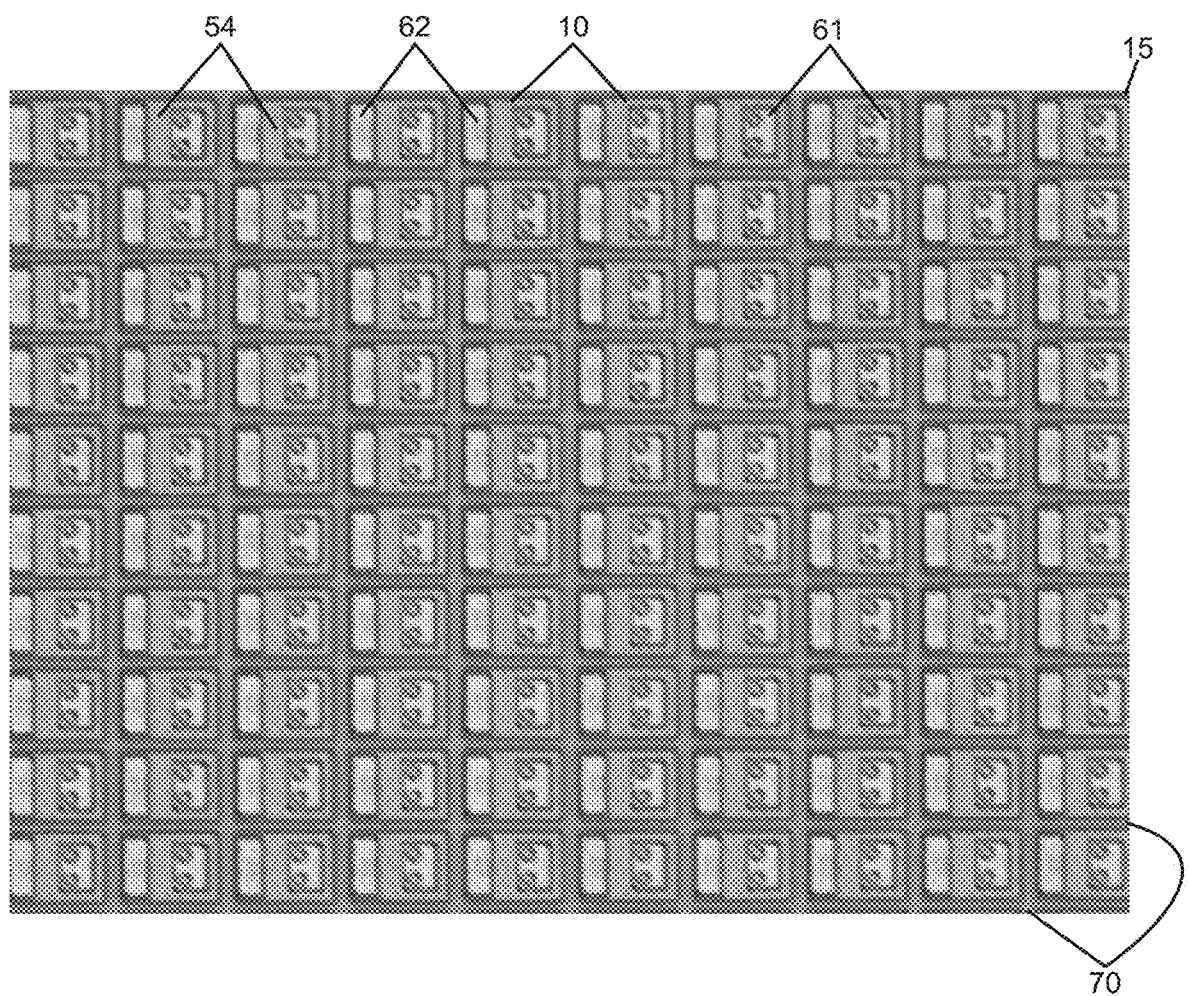
FIG._4B

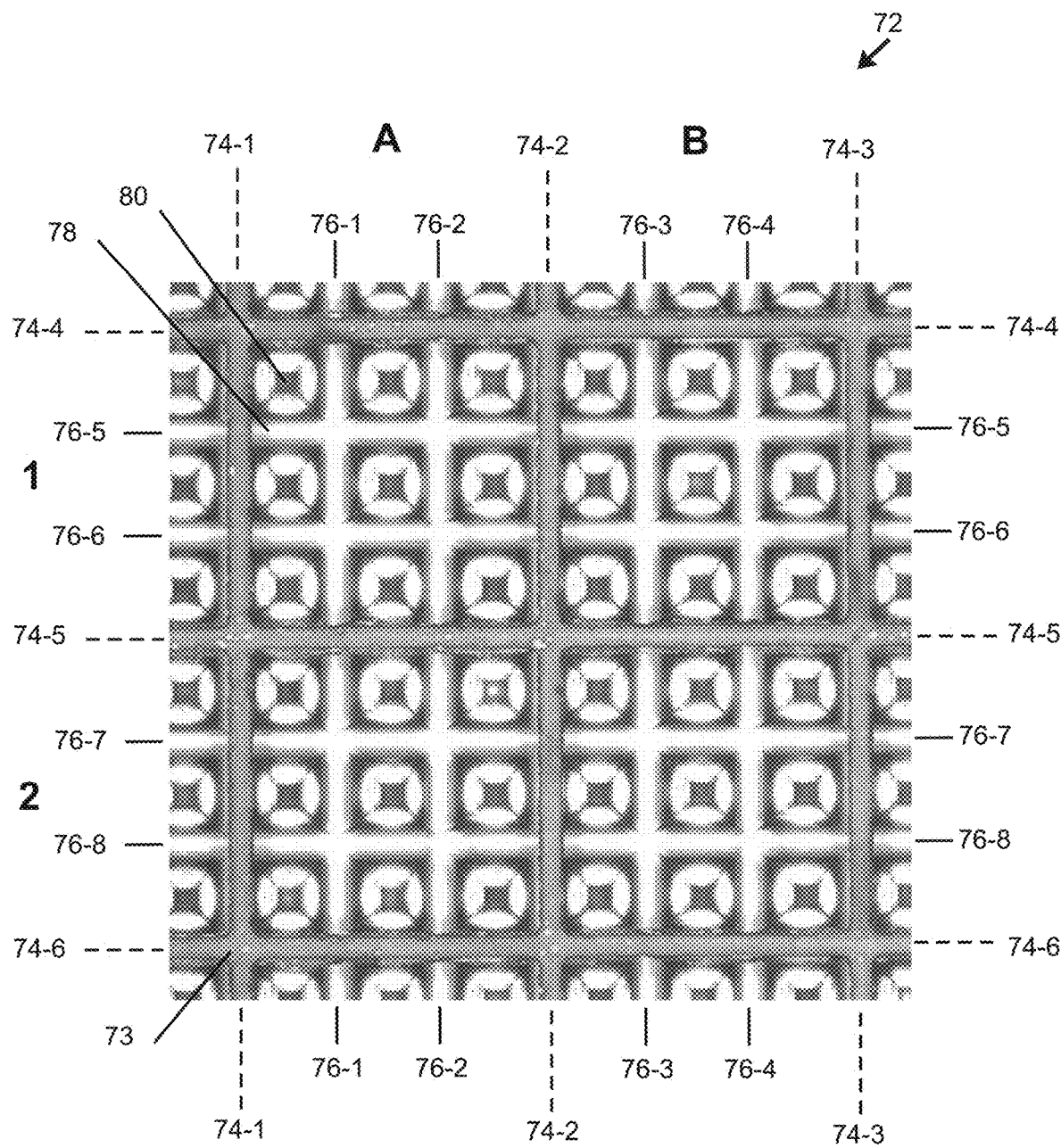
FIG._5

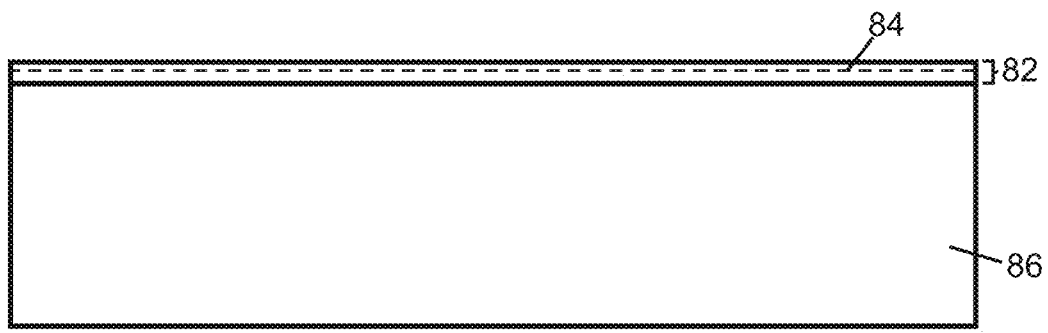
FIG._6A
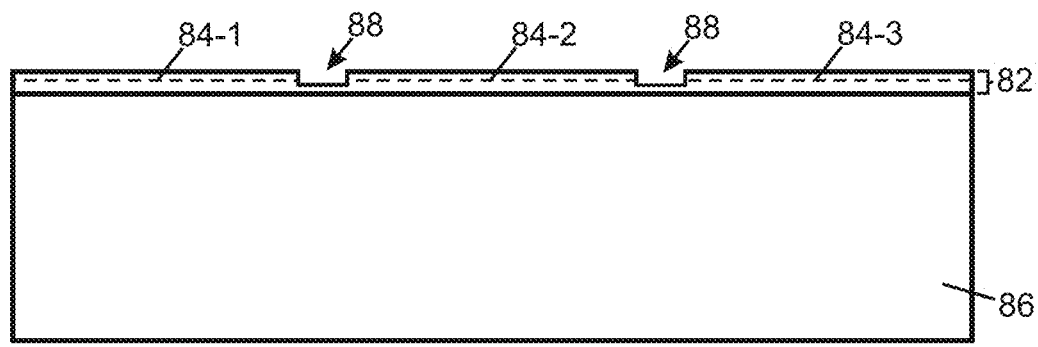
FIG._6B
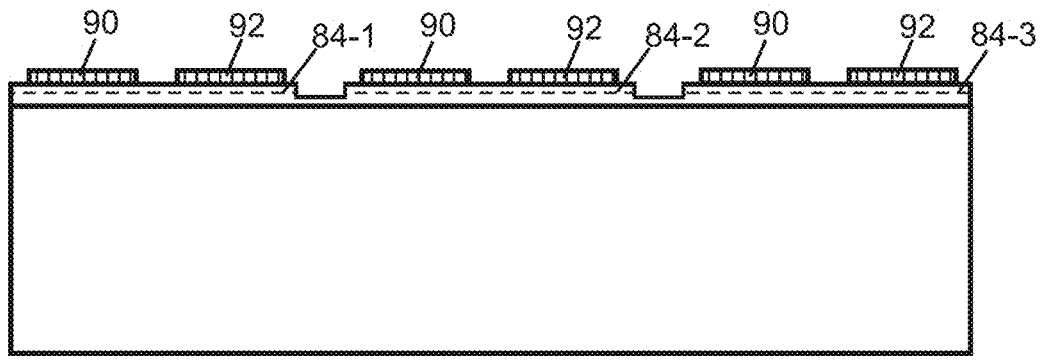
FIG._6C

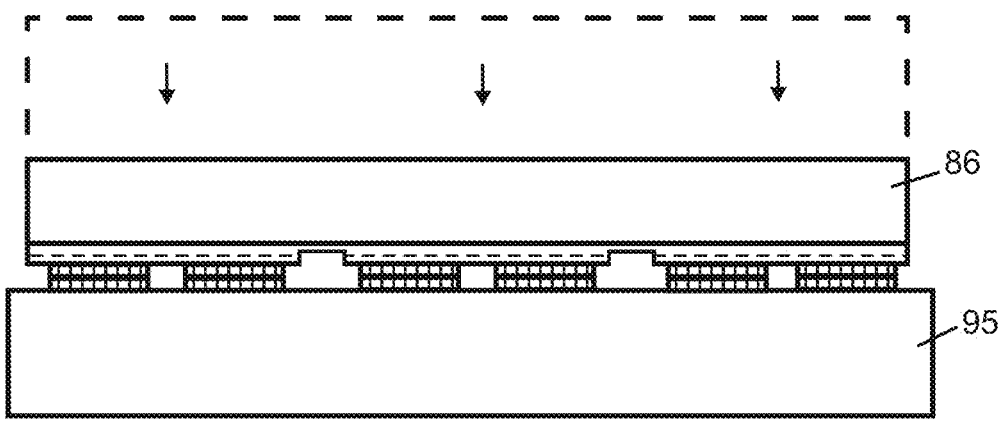
FIG._6F
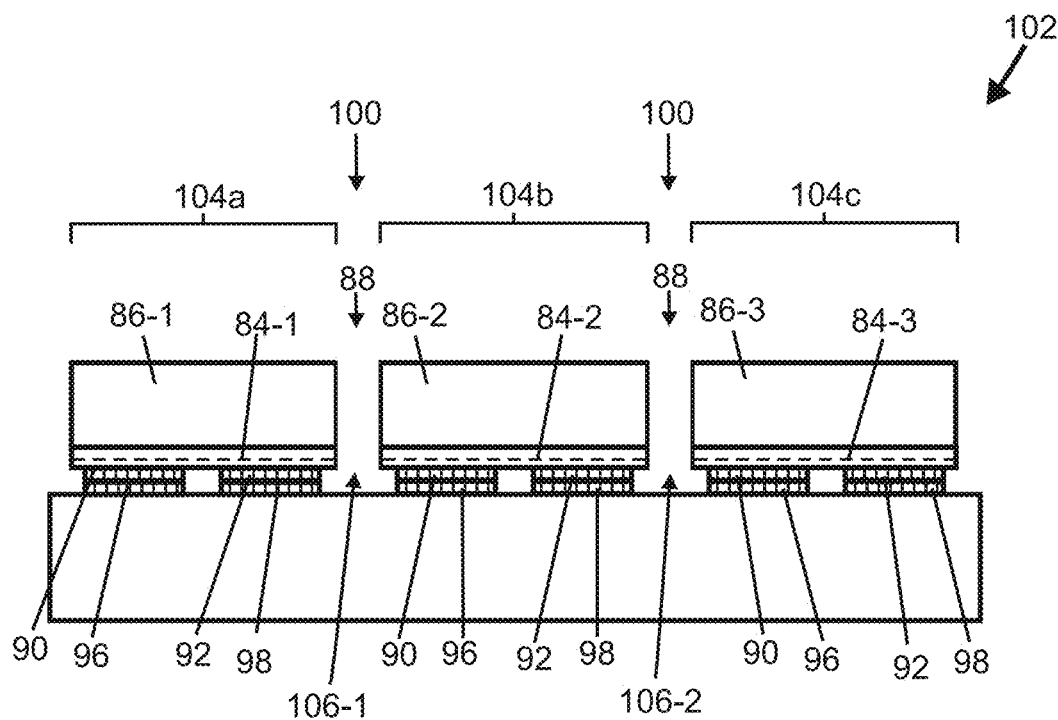
FIG._6G

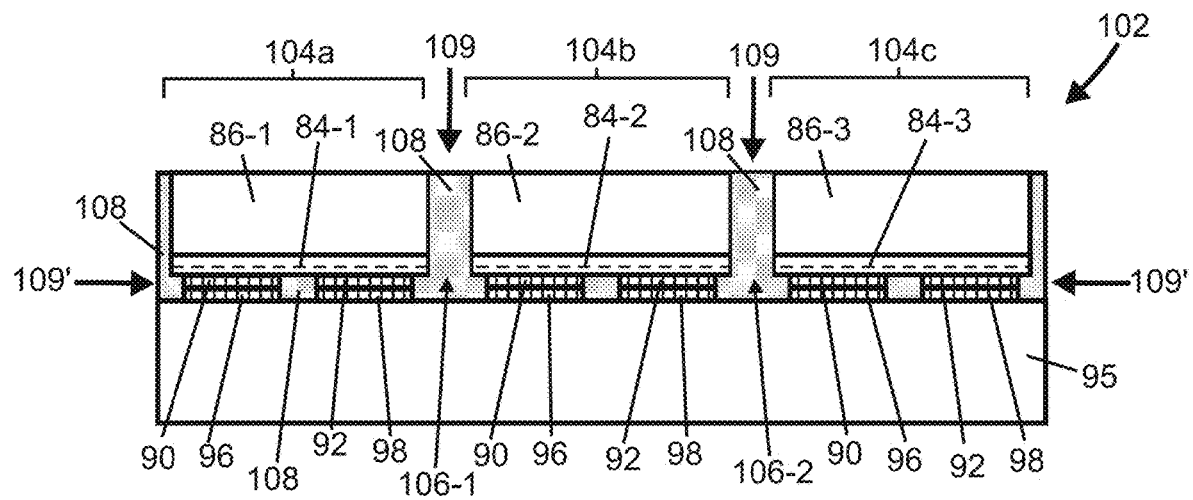
FIG._6H
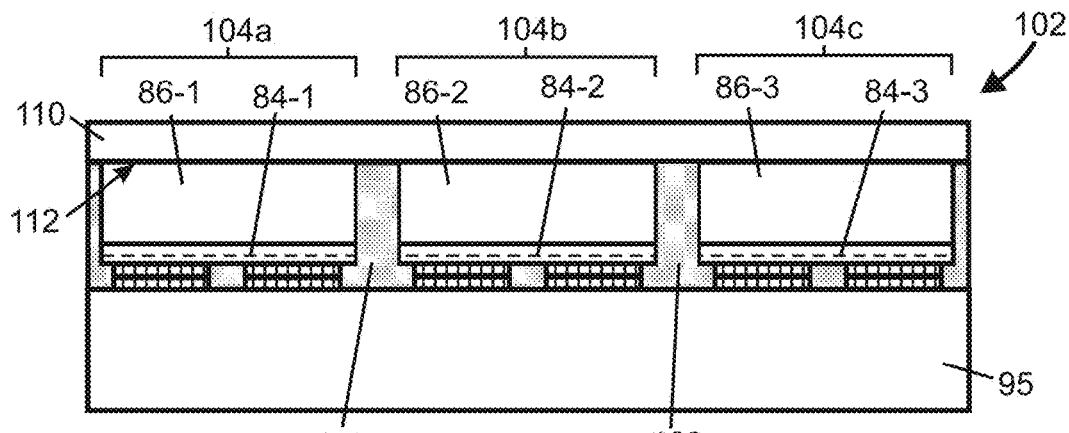
FIG._6I
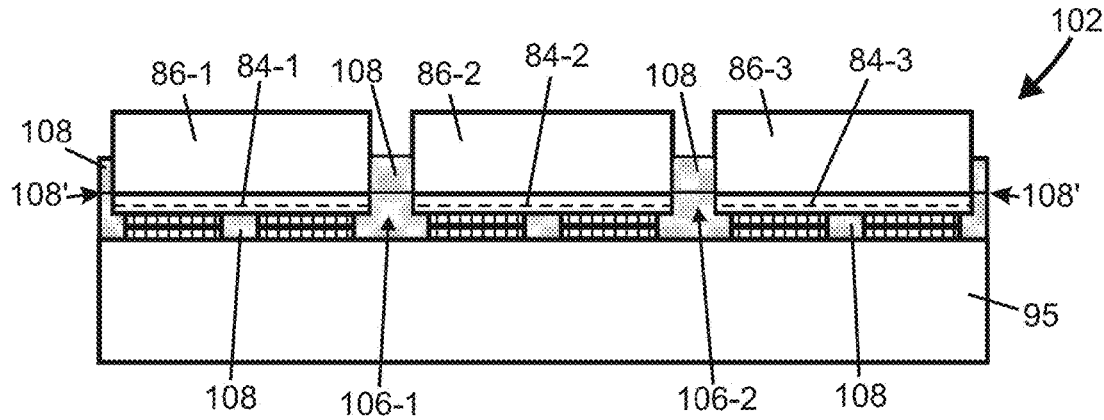
FIG._6J

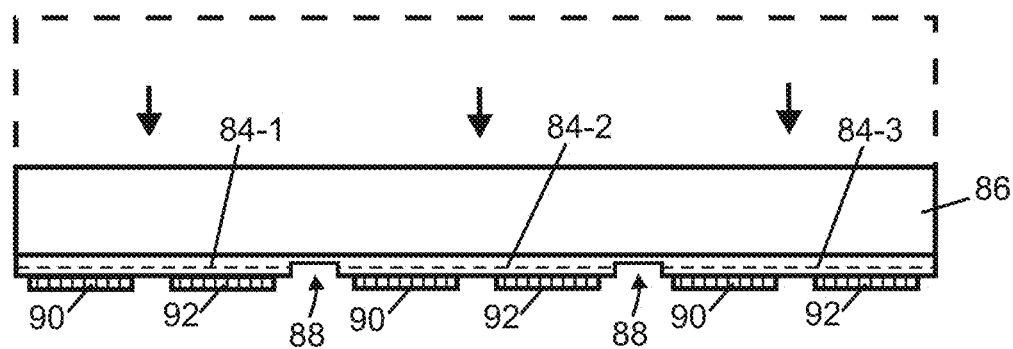
*FIG._7A*
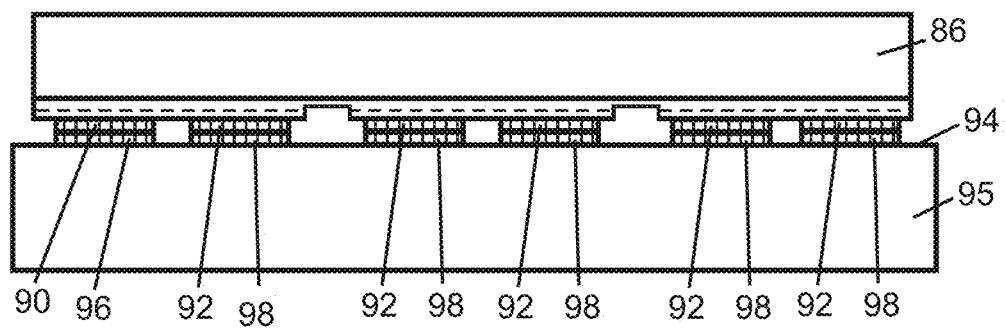
*FIG._7B*

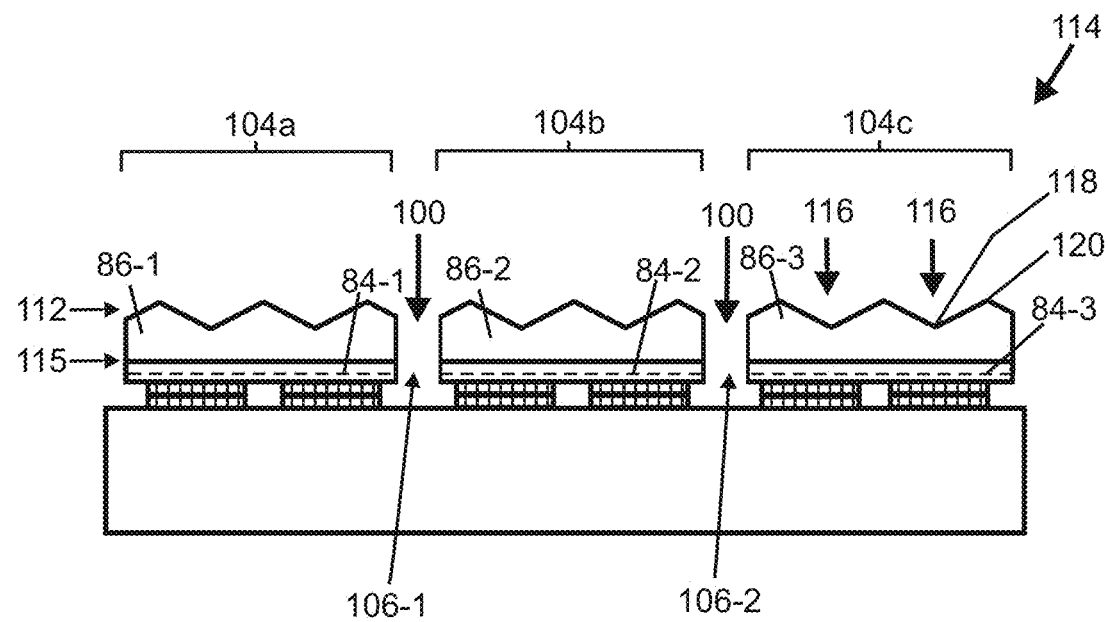
FIG._7C
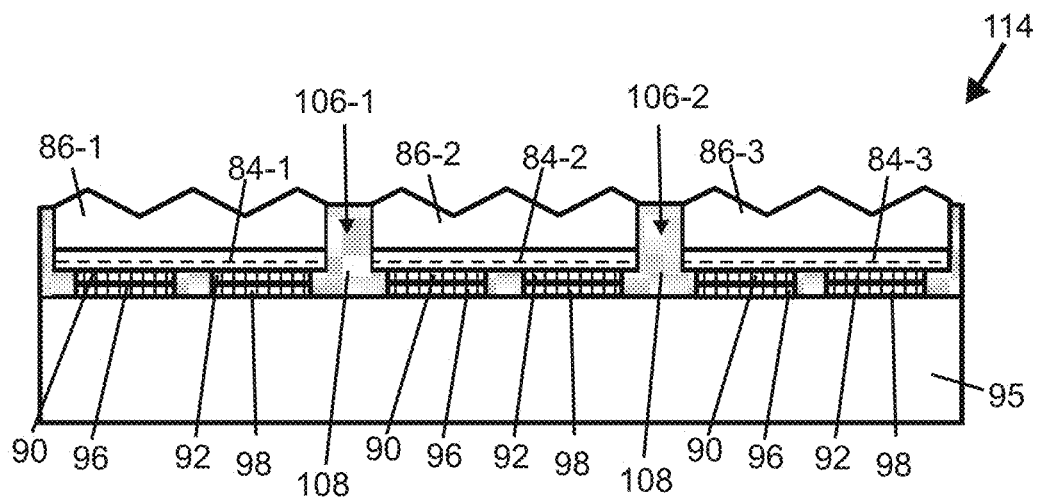
FIG._7D

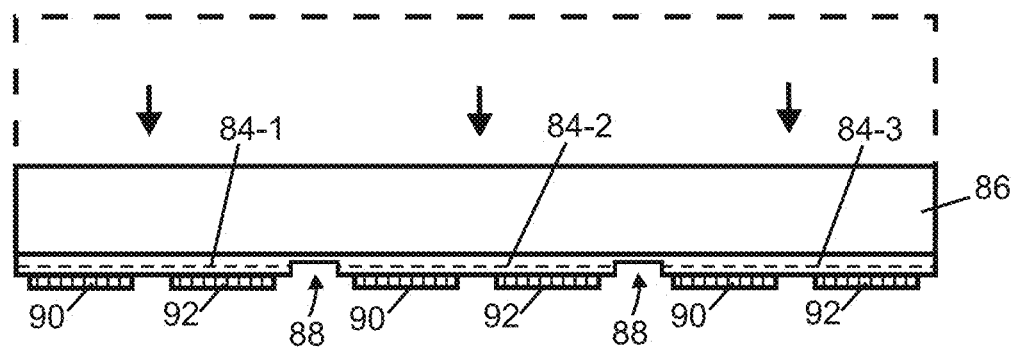
FIG._8A
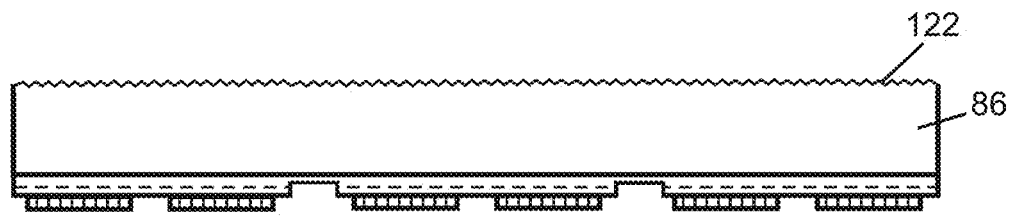
FIG._8B

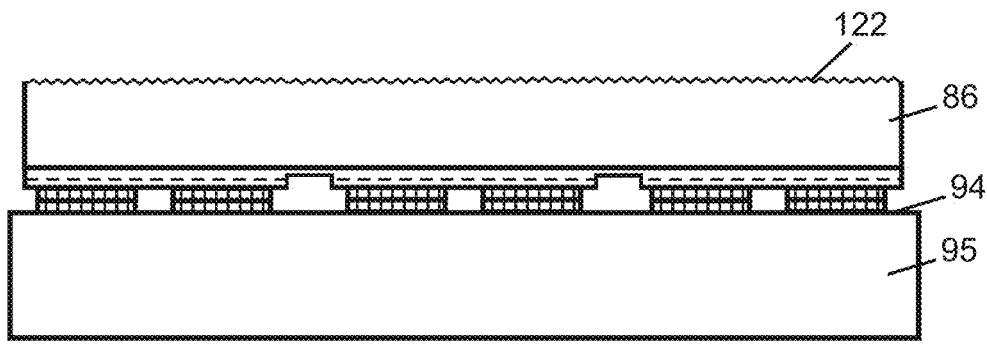
FIG._8C
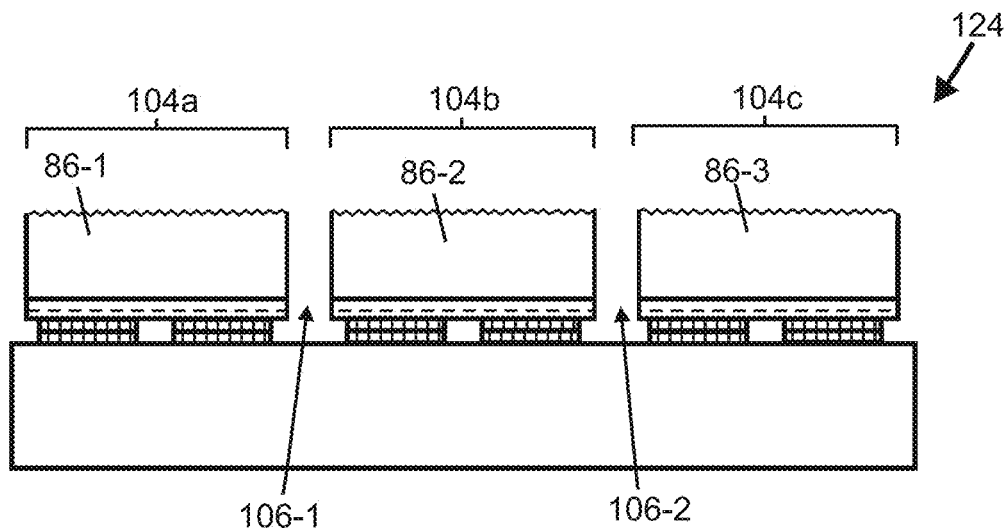
FIG._8D
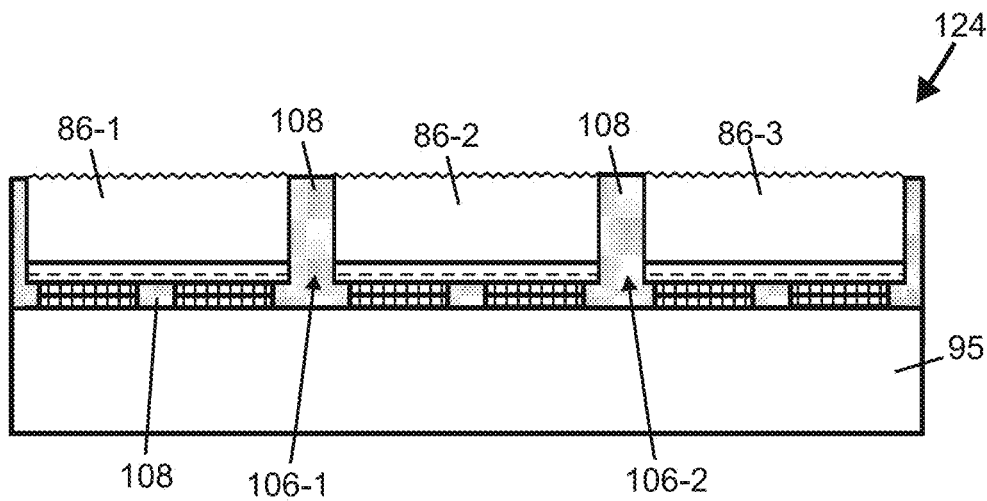
FIG._8E

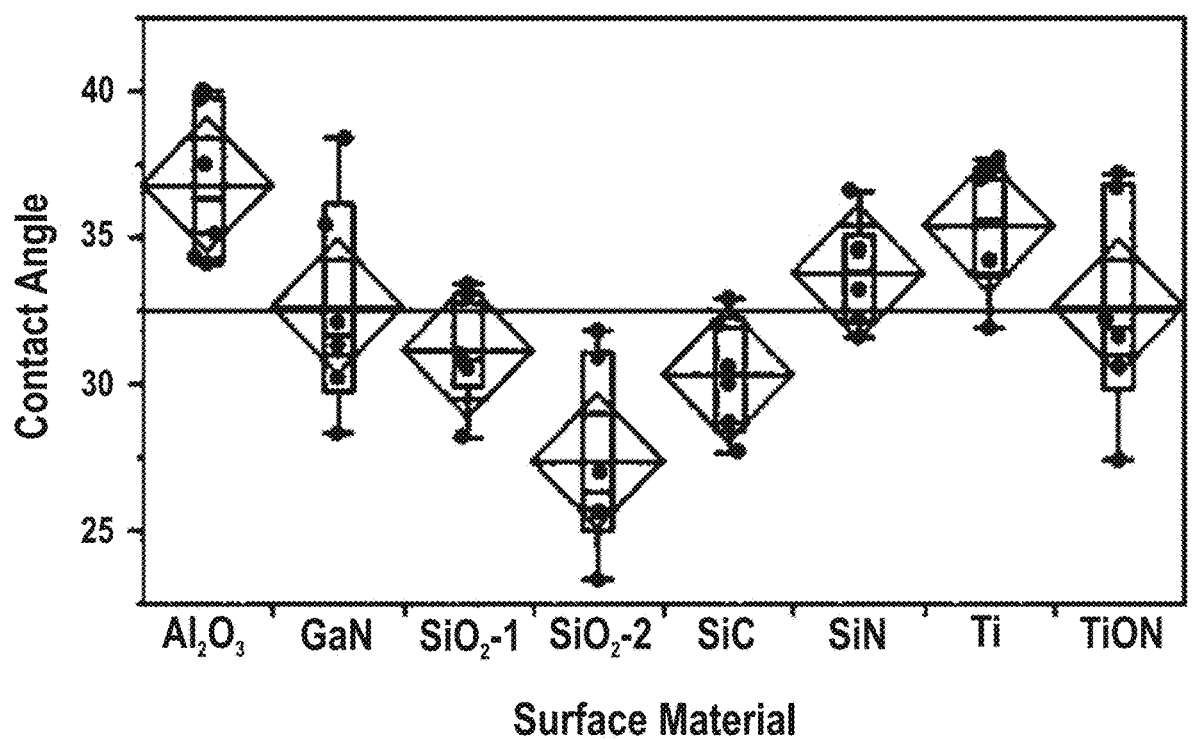
FIG._9

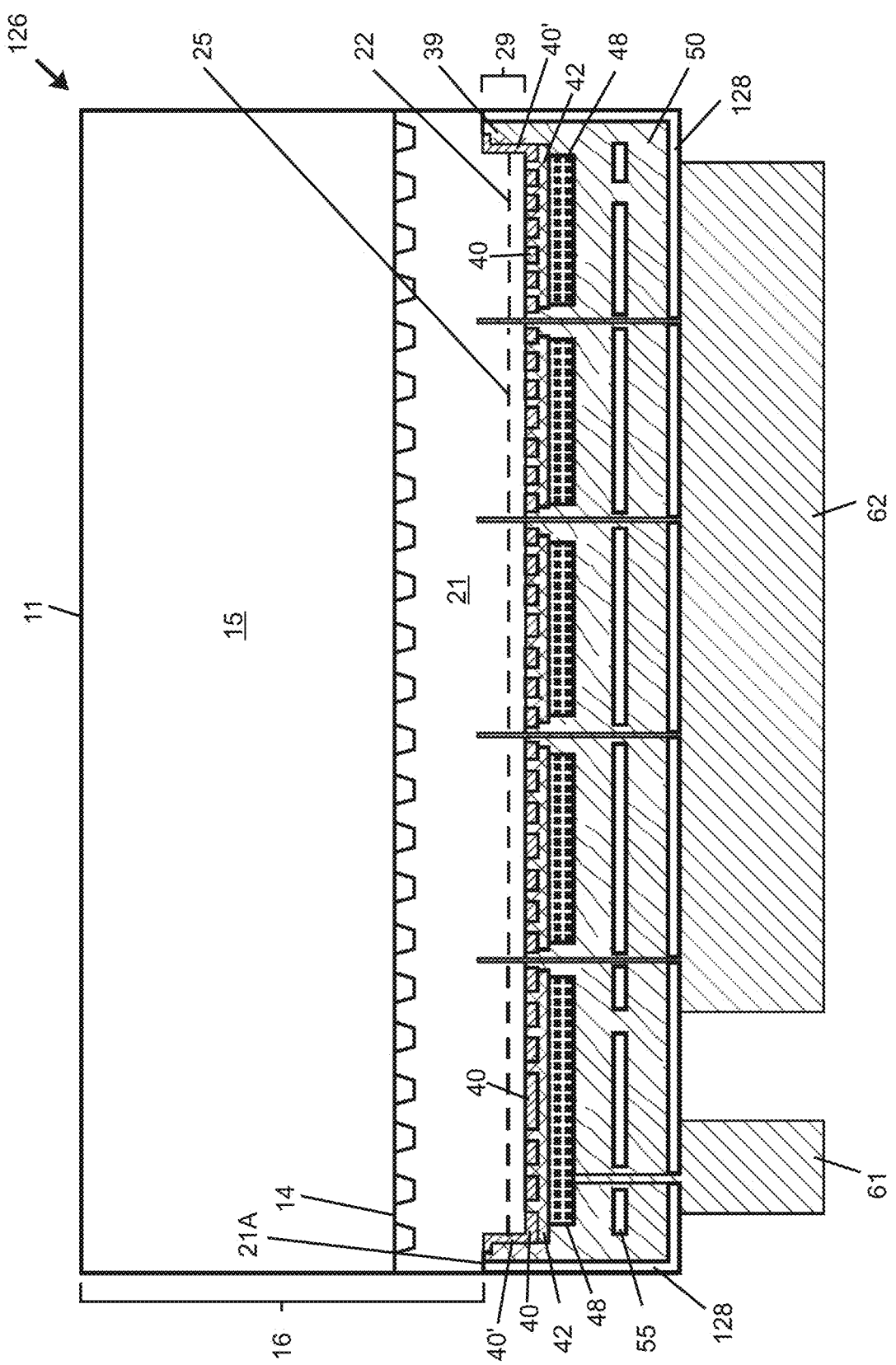
FIG._10

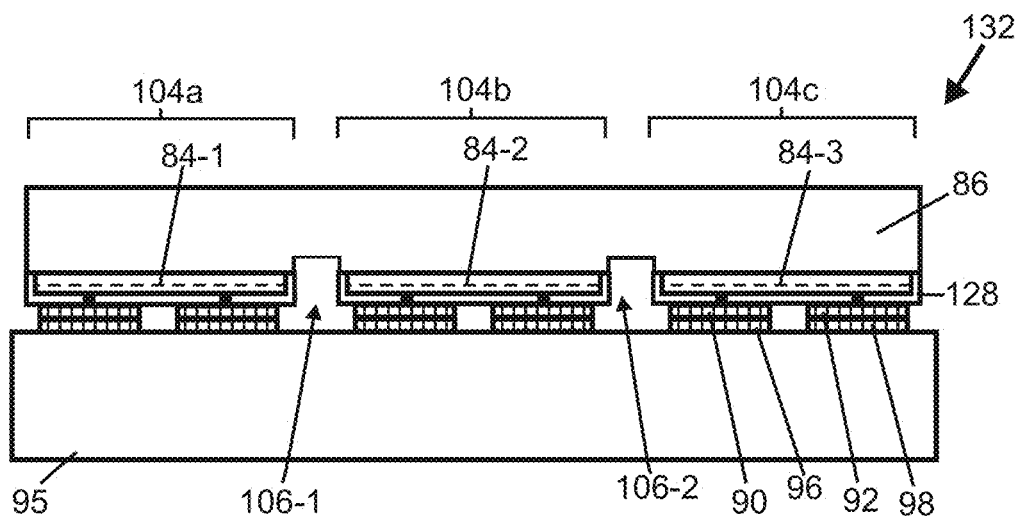
FIG._12A
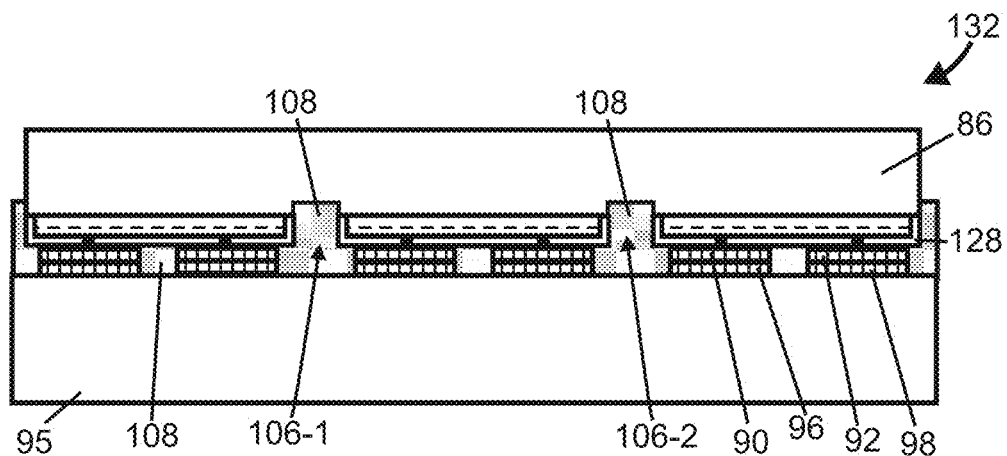
FIG._12B
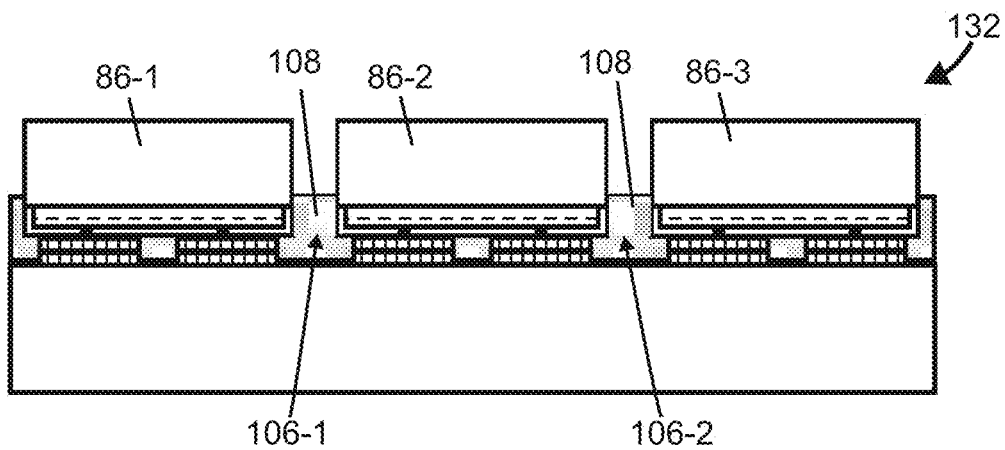
FIG._12C

PIXELATED-LED CHIPS AND CHIP ARRAY DEVICES, AND FABRICATION METHODS

TECHNICAL FIELD

Subject matter herein relates to solid state light-emitting devices, including electrically accessible light emitting diode (LED) array chips with reduced interaction between emissions of adjacent emitters, devices incorporating one or more LED array chips, and LED displays and illumination apparatuses including such devices, as well as related fabrication methods.

BACKGROUND

Light emitting diodes (LEDs) have been widely adopted in various illumination contexts, for backlighting of liquid crystal display (LCD) systems (e.g., as a substitute for cold cathode fluorescent lamps), and for sequentially illuminated LED displays. Applications utilizing LED arrays include automotive headlamps, roadway illumination, light fixtures, and various indoor, outdoor, and specialty contexts. Desirable characteristics of LED devices according to various end uses include high luminous efficacy, long lifetime, and wide color gamut.

Conventional color LCD display systems require color filters (e.g., red, green, and blue) that inherently reduce light utilization efficiency. Sequential illuminated LED displays, which utilize self-emitting LEDs and dispense with the need for backlights and color filters, provide enhanced light utilization efficiency.

Large format multi-color sequentially illuminated LED displays (including full color LED video screens) typically include numerous individual LED panels, packages, and/or components providing image resolution determined by the distance between adjacent pixels or "pixel pitch." Sequentially illuminated LED displays may include "RGB" three-color displays with arrayed red, green and blue LEDs, or "RG" two-color displays with arrayed red and green LEDs. Other colors and combinations of colors may be used. Large format displays (e.g., electronic billboards and stadium displays) intended for viewing from great distances typically have relatively large pixel pitches and usually include discrete LED arrays with multi-color (e.g., red, green, and blue) LEDs that may be independently operated to form what appears to a viewer to be a full color pixel. Medium-sized displays with relatively shorter viewing distances require shorter pixel pitches (e.g., 3 mm or less), and may include panels with arrayed red, green, and blue LED components mounted on a single electronic device attached to a driver printed circuit board (PCB) that controls the LEDs.

Various LED array applications, including (but not limited to) automotive headlamps, high resolution displays suitable for short viewing distances, and other lighting devices, may benefit from smaller pixel pitches; however, practical considerations have limited their implementation. Conventional pick-and-place techniques useful for mounting LED components and packages to PCBs may be difficult to implement in a reliable manner in high-density arrays with small pixel pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of an LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs. Moreover, addition of various light segregation or light steering structures within a beam path of one or more LEDs may result in reduced light utilization efficiency. The art continues to seek improved LED array devices with small pixel pitches while overcoming limitations associated with conventional devices and production methods.

SUMMARY

The present disclosure relates in various aspects to solid state light emitting devices including a plurality of independently electrically accessible active layer portions that form a plurality of pixels. In certain embodiments, various enhancements may beneficially provide increased contrast (i.e., reduced cross-talk between pixels) and/or promote inter-pixel illumination homogeneity, without unduly restricting light utilization efficiency. Other technical benefits may additionally or alternatively be achieved. Certain enhancements may also promote efficient manufacturability. Exemplary enhancements providing one or more technical benefits described herein include, but are not limited to: providing underfill materials with improved surface coverage between adjacent pixels; providing underfill materials with improved surface coverage between pixels and submounts on which the pixels are mounted; providing wetting layers to improve wicking or flow of underfill materials within pixelated light emitting diodes (LEDs); providing underfill materials before or after individual pixels have been formed; and providing different pixels with protruding features or textured features.

In one aspect, a pixelated-LED chip comprises: an active layer comprising a plurality of active layer portions, wherein each active layer portion of the plurality of active layer portions is independently electrically accessible to form a plurality of pixels, wherein each pixel of the plurality of pixels includes electrical contacts, and inter-pixel spaces are provided between adjacent pixels of the plurality of pixels; and an underfill material arranged in the inter-pixel spaces to cover all lateral surfaces between the adjacent pixels. In certain embodiments, the electrical contacts of each pixel comprise an anode and a cathode, and the underfill material is further arranged between the anode and the cathode of each pixel of the plurality of pixels. In certain embodiments, the underfill material comprises a light-altering or a light-reflecting material. The light-altering or light-reflecting material may comprise light-altering or light-reflecting particles suspended in a binder. The light-altering or light-reflecting particles may comprise titanium dioxide ($TiO_2$) particles and the binder comprises silicone. In certain embodiments, the pixelated-LED chip further comprises a substrate comprising a plurality of discontinuous substrate portions supporting the plurality of active layer portions, wherein each substrate portion comprises a light-transmissive material. The plurality of discontinuous substrate portions may comprise silicon carbide (SiC) or sapphire. In certain embodiments, each substrate portion comprises a light injection surface and a light extraction surface, wherein the light injection surface is arranged between the active layer and the light extraction surface, and the light extraction surface of each substrate portion comprises a plurality of protruding features and a plurality of light extraction surface recesses. In certain embodiments, each substrate portion comprises a light injection surface and a light extraction surface, wherein the light injection surface is arranged between the active layer and the light extraction surface and the light extraction surface of each substrate portion comprises a textured surface. The pixelated-LED chip may further comprise a lumiphoric material on the plurality of pixels.

In another aspect, a method for fabricating a pixelated-LED lighting device comprises: forming an LED structure on a substrate, wherein the LED structure comprises an n-type layer, a p-type layer, and an active layer therebetween; defining a plurality of recesses or streets through the active layer to form a plurality of active layer portions, wherein the plurality of recesses or streets are defined through less than an entire thickness of the n-type layer; mounting the substrate over a mounting surface; removing portions of the substrate through an entire thickness of the substrate along a plurality of regions registered with the plurality of recesses or streets to form a plurality of discontinuous substrate portions; and applying an underfill material between the substrate and the mounting surface, between adjacent active layer portions, and between adjacent substrate portions. In certain embodiments, the method further comprises thinning the substrate after said mounting of the substrate over the mounting surface. In certain embodiments, the method further comprises thinning the substrate before said mounting of the substrate over the mounting surface. In certain embodiments, the method further comprises forming a plurality of anode-cathode pairs in conductive electrical communication with the plurality of active layer portions, and wherein said applying the underfill material further comprises applying the underfill material between an anode and a cathode of each anode-cathode pair. In certain embodiments, the method further comprises forming a plurality of protruding features and a plurality of light extraction surface recesses on a light extraction surface of each of the substrate portions. In certain embodiments, the method further comprises texturizing a light extraction surface of each of the substrate portions. In certain embodiments, texturizing a light extraction surface of each of the substrate portions comprises texturizing a surface of the substrate before forming the plurality of discontinuous substrate portions. The method may further comprise depositing a wetting layer on sidewalls of the plurality of active layer portions before applying the underfill material, wherein the underfill material comprises a contact angle with a passivation layer of less than about 30 degrees. In certain embodiments, applying the underfill material comprises applying the underfill material between the discontinuous substrate portions from the top of the pixelated LED chip. Applying an underfill material may further comprise applying the underfill material to lateral edges of the pixelated LED chip.

In another aspect, a pixelated LED chip comprises: a plurality of pixels that are independently electrically accessible, wherein each pixel of the plurality of pixels includes semiconductor layers that form a mesa, a passivation layer on the semiconductor layers and laterally bounding the mesa, and electrical contacts, and wherein inter-pixel spaces are provided between adjacent pixels of the plurality of pixels; an underfill material arranged in the inter-pixel spaces between the adjacent pixels; and a wetting layer arranged between the underfill material and the passivation layer of each pixel, wherein the wetting layer is arranged to laterally bound the passivation layer along the mesa of each pixel. The electrical contacts of each pixel may comprise an anode and a cathode, and the wetting layer is further arranged between the anode and the cathode of each pixel of the plurality of pixels. In certain embodiments, the wetting layer is compositionally different than the passivation layer. The wetting layer may comprise silicon dioxide ($SiO_2$) and the passivation layer comprises silicon nitride (SiN). In certain embodiments, the wetting layer comprises a contact angle with the underfill material of less than about 30 degrees. In certain embodiments, each of the plurality of pixels further comprises a substrate supporting the semiconductor layers, and wherein the wetting layer is arranged entirely between the underfill material and the substrate of each pixel. In other embodiments, each of the plurality of pixels further comprises a substrate supporting the semiconductor layers, and wherein the wetting layer is arranged partially between the underfill material and the substrate of each pixel.

In another aspect, a pixelated-LED chip comprises: an active layer comprising a plurality of active layer portions, wherein each active layer portion of the plurality of active layer portions is independently electrically accessible to form a plurality of pixels, wherein each pixel of the plurality of pixels includes electrical contacts, and inter-pixel spaces are provided between adjacent pixels of the plurality of pixels; an underfill material arranged in the inter-pixel spaces between the adjacent pixels; and a wetting layer between the underfill material and the plurality of active layer portions, wherein the wetting layer comprises a contact angle with the underfill material of less than about 30 degrees. The wetting layer may comprise a contact angle with the underfill material in a range of about 22 degrees to about 30 degrees. In certain embodiments, the electrical contacts of each pixel comprise an anode and a cathode, and the wetting layer is further arranged between the anode and the cathode of each pixel of the plurality of pixels. In certain embodiments, the active layer portion of each pixel is peripherally bounded by a passivation layer, and the wetting layer is arranged to peripherally bound the passivation layer. In certain embodiments, the wetting layer is compositionally different from the passivation layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 is a side cross-sectional illustration of a flip chip light emitting diode (LED) being representative of flip chips useable in flip chip LED arrays according to embodiments of the present disclosure.

FIG. 2A is a plan view photograph of a flip chip LED, with a transparent substrate facing upward, useable in flip chip arrays according to embodiments of the present disclosure.

FIG. 2B is a plan view photograph of the flip chip LED of FIG. 2A, with electrodes facing upward.

FIG. 3A is a plan view photograph of a pixelated-LED chip including an array of four flip chip type LEDs on a single transparent substrate facing upward, useable in embodiments of the present disclosure.

FIG. 3B is a plan view photograph of the pixelated-LED chip of FIG. 3A, with electrodes facing upward.

FIG. 4A is a plan view photograph of a pixelated-LED chip including an array of one hundred flip chip LEDs on a single transparent substrate facing upward, useable in embodiments of the present disclosure.

FIG. 4B is a plan view photograph of the pixelated-LED chip of FIG. 4A, with electrodes facing upward.

FIG. 5 is an upper perspective view photograph of a portion of a pixelated-LED light emitting device according to some embodiments of the present disclosure.

FIGS. 6A-6J are schematic cross-sectional views of various states of fabrication of a pixelated-LED chip that includes an underfill material arranged in inter-pixel spaces between adjacent pixels.

FIGS. 7A-7D are schematic cross-sectional views of various states of fabrication of a pixelated-LED chip that includes substrate portions with protruding features and light extraction surface recesses as well as an underfill material arranged in inter-pixel spaces.

FIGS. 8A-8E are schematic cross-sectional views of various states of fabrication of a pixelated-LED chip that includes substrate portions with textured surfaces as well as an underfill material arranged in inter-pixel spaces.

FIG. 9 is a comparison plot illustrating contact angles between various wetting layer materials and an underfill material.

FIG. 10 illustrates a representative LED chip that includes a wetting layer configured to promote improved wetting or wicking of an underfill material.

FIGS. 12A-12C are schematic cross-sectional views of various states of fabrication of a pixelated-LED chip that includes a wetting layer and an underfill material that has been arranged in inter-pixel spaces before discontinuous substrate portions are formed.

DETAILED DESCRIPTION

Figure 6D:
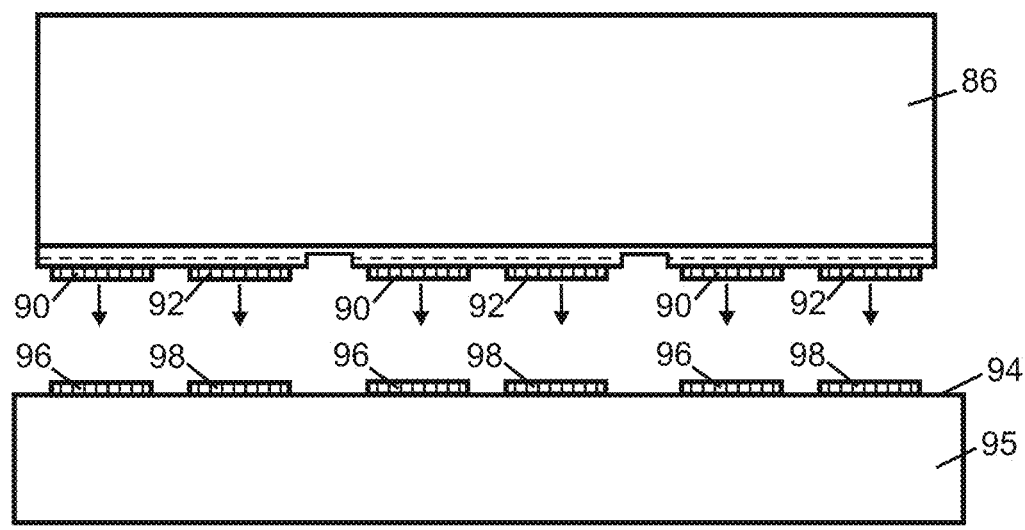

Solid state light emitting devices disclosed herein include a plurality of independently electrically accessible active layer portions that form a plurality of pixels. In certain embodiments, various enhancements may beneficially provide increased contrast (i.e., reduced cross-talk between pixels) and/or promote inter-pixel homogeneity, without unduly restricting light utilization efficiency. Efficient manufacturability of a lighting device may also be provided. Additional and/or alternative beneficial effects are contemplated. Exemplary enhancements to provide one or more technical benefits described herein include, but are not limited to: providing underfill materials with improved surface coverage between adjacent pixels; providing underfill materials with improved surface coverage between pixels and submounts on which the pixels are mounted; providing wetting layers to improve wicking or flow of the underfill material within pixelated-light emitting diodes (LEDs); providing underfill materials before or after individual pixels have been formed; and providing different pixels with protruding features or textured features.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "pixelated-LED chip" refers to an inorganic light emitting device or precursor thereof, in which a body or film comprising at least one layer or region made of a semiconductor material and being configured into sub-regions or pixels to emit visible light, infrared and/or ultraviolet light when a current is applied. The pixelated-LED chip may include an active layer that is segregated into a plurality of active layer portions such that each pixel comprises a different active layer portion. The pixelated-LED chip may also include a substrate that supports the active layer. The substrate may be segregated, either partially or entirely through a thickness of the substrate, into a plurality of substrate portions that support a different active layer portion in each pixel. Depending on the embodiment, the pixelated-LED chip may include lumiphoric materials, including phosphors or other conversion materials, and other physical optical structures that are integral with the pixelated-LED chip.

As used herein, an "active layer" or an "active region" of a solid state light emitting device refers to the layer or region in which majority and minority electronic carriers (e.g., holes and electrons) recombine to produce light. In general, an active layer or region according to embodiments disclosed herein can include a double heterostructure or a well structure, such as a quantum well structure. An active layer or region can include multiple layers or regions, such as a multiple quantum well structure.

As used herein, a "wetting layer" refers to a layer of material intended to reduce surface tension and promote wicking of an underfill material when the underfill material an uncured, flowable state. In certain embodiments, the underfill material may comprise a silicone binder containing titanium dioxide particles.

Solid state light emitting devices disclosed herein may include at least one solid state light source (e.g., an LED or a pixelated-LED chip) and one or more lumiphoric materials (also referred to herein as lumiphors) arranged to receive emissions of the at least one solid state light source. A lumiphoric material may include one or more of a phosphor, a scintillator, a lumiphoric ink, a quantum dot material, a day glow tape, or the like. In certain embodiments, a lumiphoric material may be in the form of one or more phosphors and/or quantum dots arranged in a binder such as silicone or glass, arranged in the form of a single crystalline plate or layer, a polycrystalline plate or layer, and/or a sintered plate. In certain embodiments, a lumiphoric material such as a phosphor may be spin coated or sprayed on a surface of an LED array or a pixelated-LED chip. In certain embodiments, a lumiphoric material may be located on a growth substrate, on epitaxial layers, and/or on a carrier substrate of an LED array or a pixelated-LED chip. If desired, multiple pixels including one or more lumiphoric materials may be manufactured in a single plate. In general, a solid state light source may generate light having a first peak wavelength. At least one lumiphor receiving at least a portion of the light generated by the solid state light source may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions of one or more flip chip LEDs or pixels of a pixelated-LED chip, optionally in combination with one or more lumiphoric materials, may be arranged to provide cool white, neutral white, or warm white light, such as within a color temperature range of from 2500 K to 10,000 K. In certain embodiments, lumiphoric materials having cyan, green, amber, yellow, orange, and/or red peak wavelengths may be used. In certain embodiments, lumiphoric materials may be added to one or more emitting surfaces (e.g., a top surface and one or more edge surfaces) by methods such as spray coating, dipping, liquid dispensation, powder coating, inkjet printing, or the like. In certain embodiments, lumiphoric material may be dispersed in an encapsulant, adhesive, or other binding medium.

In certain embodiments, photolithographic patterning or other stencil-type patterning may be used to permit different lumiphoric materials to be applied on or over different pixels associated with a substrate to provide lumiphoric materials and/or scattering materials that differs in (a) composition, (b) concentration, (c) particle size, or (d) distribution with respect to different pixels.

In certain embodiments, a scattering material may be added over or incorporated into a lumiphoric material. The scattering material may include scattering particles arranged in a binder, such as silicone. The scattering particles affect total internal reflection (TIR) of light to promote scattering and mixing of light that interacts with the scattering material. The scattering particles may include fused silica, fumed silica, or particles of titanium dioxide ($TiO_2$), among others. In some embodiments, the scattering material includes a layer of scattering particles suspended in a binder that is applied on the lumiphoric material. In other embodiments, the scattering particles may be included within the lumiphoric material such that the lumiphoric material comprises lumiphoric particles and scattering particles suspended in the same binder.

As used herein, a layer or region of a light emitting device may be considered to be "transparent" when at least 70% of emitted radiation that impinges on the layer or region emerges through the layer or region. For example, in the context of LEDs configured to emit visible light, suitably pure crystalline substrate materials of silicon carbide (SiC) or sapphire may be considered transparent. Moreover, as used herein, a layer or region of an LED is considered to be "reflective" or embody a "reflector" when at least 70% of the angle averaged emitted radiation that impinges on the layer or region is reflected. In some embodiments, an LED is considered to be "reflective" or embody a "reflector" when at least 90% of the angle averaged emitted radiation that impinges on the layer or region is reflected. For example, in the context of gallium nitride (GaN)-based blue and/or green LEDs, silver (Ag) (for example, at least 70% reflective, or at least 90% reflective) may be considered a reflective or reflecting material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Certain embodiments disclosed herein relate to the use of flip chip LED devices or flip chip pixelated-LED chips in which a light-transmissive substrate represents the exposed light emitting surface. In certain embodiments, the light-transmissive substrate embodies or includes an LED growth substrate, wherein multiple LEDs are grown on the same substrate that forms a light emitting surface or region. In certain embodiments, a pixelated-LED chip includes multiple active layer portions formed from an active layer grown on a growth substrate. In certain embodiments, the pixels may share functional layers of the pixelated-LED chip. In certain embodiments, one or more portions (or the entirety) of a growth substrate and/or portions of epitaxial layers may be thinned or removed. In certain embodiments, a second substrate (such as a carrier substrate or a temporary substrate to perform chip processing) may be added to the pixelated- LED chip or precursor thereof, whether or not a growth substrate has been partially or fully removed. In certain embodiments, a light-transmissive substrate includes SiC, sapphire, or glass. Multiple LEDs (e.g., flip chip LEDs or flip chip pixels) may be grown on a substrate and incorporated into a light emitting device. In certain embodiments, a substrate (e.g., silicon (Si)) may include vias arranged to make contact with LED chips mounted or grown thereon. In certain embodiments, as an alternative to using flip chips, individual LEDs or LED packages may be individually placed and mounted on or over a substrate to form an array. For example, multiple wafer level packaged LEDs may be used to form LED arrays or subarrays.

When LEDs embodying a flip chip configuration are used, desirable flip chip LEDs incorporate multi-layer reflectors and incorporate light-transmissive (preferably transparent) substrates that are optionally patterned along an internal surface adjacent to semiconductor layers. A flip chip LED, or a flip chip pixel in some embodiments, includes anode and cathode contacts that are spaced apart and extend along the same face, with such face opposing a face defined by the light-transmissive (preferably transparent) substrate. A flip chip LED may be termed a horizontal structure, as opposed to a vertical structure having contacts on opposing faces of an LED chip. In certain embodiments, the transparent substrate may be patterned, roughened, or otherwise textured to provide a varying surface that increases the probability of refraction over internal reflection, so as to enhance light extraction. A substrate may be patterned or roughened by any of various methods known in the art, including (but not limited to) formation of nano-scale features by etching (e.g., photolithographic etching) using any suitable etchants, optionally in combination with one or more masks.

Patterning or texturing of a substrate may depend on the substrate material as well as implications on light extraction efficiency and/or pixel separation. If a SiC substrate bearing multiple LEDs (e.g., flip chip LEDs or flip chip pixels) is used, then the index of refraction of the SiC is well-matched to a GaN-based active region of an LED, so light emissions of the active region tend to enter the substrate easily. If a sapphire substrate bearing multiple LEDs (e.g., flip chip LEDs or flip chip pixels) is used, then it may be desirable to provide a patterned, roughened, or textured interface between the active region and the substrate to promote passage of LED emissions into the substrate. With respect to a light extraction surface of a substrate, in certain embodiments it may be desirable to provide a patterned, roughened, or textured surface to promote extraction of light from the substrate. In embodiments where a growth substrate is removed, a GaN epitaxial light emitting surface can be roughened, patterned and/or textured.

In certain embodiments, LEDs or pixels may be grown on a first substrate of a first material (e.g., Si, SiC, or sapphire), the first (growth) substrate may be partially removed (e.g., thinned) or fully removed, and the LEDs or pixels may be bonded to, mounted to, or otherwise supported by a second substrate of a second material (e.g., glass, sapphire, etc.) through which LED emissions are transmitted, wherein the second material is preferably more transmissive of LED emissions than the first material. Removal of the first (growth) substrate may be done by any appropriate method, such as by use of an internal parting region or parting layer that is weakened and/or separated by: application of energy (e.g., laser rastering, sonic waves, heat, etc.), fracturing, one or more heating and cooling cycles, chemical removal, and/or mechanical removal (e.g., including one or more grinding, lapping, and/or polishing steps), or by any appropriate combination of techniques. In certain embodiments, one or more substrates may be bonded or otherwise joined to a carrier. Bonding of one or more LEDs or pixels to a substrate, or bonding of substrates to a carrier, may be performed by any suitable methods. Any suitable wafer bonding technique known in the art may be used such as van der Waals bonds, hydrogen bonds, covalent bonds, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. In certain embodiments, one or more adhesion promoting materials may additionally or alternatively be used.

In certain embodiments, an LED array includes multiple flip chip LEDs or flip chip pixels grown on a single first (or growth) substrate, with the first substrate removed from the LEDs, and a second substrate (or carrier) added to the LEDs, with the second substrate including one or more reflective layers, vias, and a phosphor layer (e.g., spin-coated phosphor layer). In certain embodiments, an LED array includes multiple flip chip LEDs or flip chip pixels grown on a single growth substrate, wherein grooves, recesses, or other features are defined in the growth substrate and/or a carrier, and are used to form light-affecting elements, optionally being filled with one or more materials such as to form a grid between individual LEDs or pixels.

In certain embodiments utilizing flip chip LEDs or flip chip pixels, a light-transmissive substrate, a plurality of semiconductor layers, a multi-layer reflector, and a passivation layer may be provided. The light-transmissive substrate is preferably transparent with a patterned surface including a plurality of recessed features and/or a plurality of raised features. The plurality of semiconductor layers is adjacent to the patterned surface, and includes a first semiconductor layer comprising doping of a first type and a second semiconductor layer comprising doping of a second type, wherein a light emitting active region is arranged between the first semiconductor layer and the second semiconductor layer. The multi-layer reflector is arranged proximate to the plurality of semiconductor layers and includes a metal reflector layer and a dielectric reflector layer, wherein the dielectric reflector layer is arranged between the metal reflector layer and the plurality of semiconductor layers. The passivation layer is arranged between the metal reflector layer and first and second electrical contacts, wherein the first electrical contact is arranged in conductive electrical communication with the first semiconductor layer, and the second electrical contact is arranged in conductive electrical communication with the second semiconductor layer. In certain embodiments, a first array of conductive microcontacts extends through the passivation layer and provides electrical communication between the first electrical contact and the first semiconductor layer, and a second array of conductive microcontacts extends through the passivation layer. In certain embodiments, a substrate useable for forming and supporting an array of flip chip LEDs or flip chip pixels may include sapphire; alternatively, the substrate may include Si, SiC, a Group III-nitride material (e.g., GaN), or any combination of the foregoing materials (e.g., Si on sapphire, etc.). Further details regarding fabrication of flip chip LEDs are disclosed in U.S. Patent Application Publication No. 2017/0098746A1, with the entire contents thereof being hereby incorporated by reference herein.

FIG. 1 illustrates a single flip chip LED 10 including a light-transmissive substrate 15, first and second electrical contacts 61, 62, and a functional stack 60 (incorporating at least one light emitting active region 25) arranged therebetween. The flip chip LED 10 includes an internal light-transmissive surface 14 that is patterned (with multiple recessed and/or raised features 17) proximate to multiple semiconductor layers 21, 22 of the LED 10, including a multi-layer reflector proximate to the semiconductor layers 21, 22 according to one embodiment. The light-transmissive (preferably transparent) substrate 15 has an outer major surface 11, side edges 12, and the patterned surface 14. The multiple semiconductor layers 21, 22 sandwiching the light emitting active region 25 are adjacent to the patterned surface 14, and may be deposited via vapor phase epitaxy or any other suitable deposition process. In one implementation, a first semiconductor layer 21 proximate to the substrate 15 embodies an n-doped material (e.g., n-GaN), and a second semiconductor layer 22 embodies a p-doped material (e.g., p-GaN). A central portion of the multiple semiconductor layers 21, 22 including the active region 25 extends in a direction away from the substrate 15 to form a mesa 29 that is laterally bounded by at least one recess 39 containing a passivation material (e.g., silicon nitride (SiN) as part of a passivation layer 50), and that is vertically bounded by surface extensions 21A of the first semiconductor layer 21.

The multi-layer reflector is arranged proximate to (e.g., on) the second semiconductor layer 22, with the multi-layer reflector consisting of a dielectric reflector layer 40 and a metal reflector layer 42. The dielectric reflector layer 40 is arranged between the metal reflector layer 42 and the second semiconductor layer 22. In certain implementations, the dielectric reflector layer 40 comprises silicon dioxide ($SiO_2$), and the metal reflector layer 42 comprises Ag. Numerous conductive vias 41-1, 41-2 are defined in the dielectric reflector layer 40 and are preferably arranged in contact between the second semiconductor layer 22 and the metal reflector layer 42. In certain implementations, the conductive vias 41-1, 41-2 comprise substantially the same material(s) as the metal reflector layer 42.

In certain implementations, at least one (preferably both) of the dielectric reflector layer 40 and the metal reflector layer 42 is arranged over substantially the entirety of a major surface of the mesa 29 terminated by the second semiconductor layer 22 (e.g., at least about 90%, at least about 92%, or at least about 95% of the major (e.g., lower) surface of the mesa 29 of the second semiconductor layer 22).

A barrier layer 48 (including first and second portions 48-1, 48-2) is preferably provided between the metal reflector layer 42 and the passivation layer 50. In certain implementations, the barrier layer 48 comprises sputtered titanium (Ti)/platinum (Pt) followed by evaporated gold (Au), or comprises sputtered Ti/nickel (Ni) followed by evaporated Ti/Au. In certain implementations, the barrier layer 48 may function to prevent migration of metal from the metal reflector layer 42. The passivation layer 50 is arranged between the barrier layer 48 and (i) the first externally accessible electrical contact (e.g., electrode, or cathode) 61 and (ii) the second externally accessible electrical contact (e.g., electrode, or anode) 62, which are both arranged along a lower surface 54 of the flip chip LED 10 separated by a gap 59. In certain implementations, the passivation layer 50 comprises SiN. The passivation layer 50 includes a metal-containing interlayer 55 arranged therein, wherein the interlayer 55 may include (or consist essentially of) aluminum (Al) or another suitable metal.

The LED 10 includes first and second arrays of microcontacts 63, 64 extending through the passivation layer 50, with the first array of microcontacts 63 providing conductive electrical communication between the first electrical contact 61 and the first (e.g., n-doped) semiconductor layer 21, and with the second array of microcontacts 64 providing conductive electrical communication between the second electrical contact 62 and the second (e.g., p-doped) semiconductor layer 22. The first array of microcontacts 63 extends from the first electrical contact 61 (e.g., n-contact) through the passivation layer 50, through openings defined in the interlayer 55, through openings 52 defined in the first portion 48-1 of the barrier layer 48, through openings defined in a first portion 42-1 of the metal reflector layer 42, through openings defined in a first portion 40-1 of the dielectric reflector layer 40, through the second semiconductor layer 22, and through the active region 25 to terminate in the first semiconductor layer 21. Within the openings defined in the interlayer 55, the first portion 48-1 of the barrier layer 48, the first portion 42-1 of the metal reflector layer 42, and the first portion 40-1 of the dielectric reflector layer 40, dielectric material of the dielectric reflector layer 40 laterally encapsulates the first array of microcontacts 63 to prevent electrical contact between the first array of microcontacts 63 and the respective layers 55, 48, 42, 40. The conductive vias 41-1 defined in the first portion 40-1 of the dielectric reflector layer 40 contact the first portion 40-1 of the dielectric reflector layer 40 and the second semiconductor layer 22, which may be beneficial to promote current spreading in the active region 25. The second array of microcontacts 64 extends from the second electrical contact 62 through the passivation layer 50 and through the openings defined in the interlayer 55 to at least one of (i) the second portion 48-2 of the barrier layer 48, and (ii) a second portion 42-2 of the metal reflector layer 42, wherein electrical communication is established between the metal reflector layer 42 and the second semiconductor layer 22 through the conductive vias 41-2 defined in a second portion 40-2 of the dielectric reflector layer 40. Although the second array of microcontacts 64 is preferred in certain implementations, in other implementations, a single second microcontact may be substituted for the second array of microcontacts 64. Similarly, although it is preferred in certain implementations to define multiple vias 41-2 in the second portion 40-2 of the dielectric reflector layer 40, in other implementations, a single via or other single conductive path may be substituted for the conductive vias 41-2.

Following formation of the passivation layer 50, one or more side portions 16 extending between the outer major surface 11 of the substrate 15 and the surface extensions 21A of the first semiconductor layer 21 are not covered with passivation material. Such side portions 16 embody a non-passivated side surface.

In operation of the flip chip LED 10, current may flow from the first electrical contact (e.g., n-contact or cathode) 61, the first array of microcontacts 63, and the first (n-doped) semiconductor layer 21 into the active region 25 to generate light emissions. From the active region 25, current flows through the second (p-doped) semiconductor layer 22, the conductive vias 41-2, the second metal reflector layer portion 42-2, the second barrier layer portion 48-2, and the second array of microcontacts 64 to reach the second electrical contact (e.g., p-contact or anode) 62. Emissions generated by the active region 25 are initially propagated in all directions, with the reflector layers 40, 42 serving to reflect emissions in a direction generally toward the substrate 15. As emissions reach the patterned surface 14 arranged between the substrate 15 and the first semiconductor layer 21, the recessed and/or raised features 17 arranged in or on the patterned surface 14 promote refraction rather than reflection at the patterned surface 14, thereby increasing the opportunity for photons to pass from the first semiconductor layer 21 into the substrate 15 and thereafter exit the LED 10 through the outer major surface 11 and non-passivated side portions 16. In certain implementations, one or more surfaces of the LED 10 may be covered with one or more lumiphoric materials (not shown), to cause at least a portion of emissions emanating from the LED 10 to be up-converted or down-converted in wavelength.

FIGS. 2A and 2B are plan view photographs of a single flip chip LED 10 similar in structure and operation to the flip chip LED 10 of FIG. 1. Referring to FIG. 2A, the flip chip LED 10 includes an outer major surface 11 arranged for extraction of LED emissions, and includes an active region having a length L and a width W. In certain embodiments, the active region includes a length L of about 280 microns (pm), and a width W of about 220 μm, and a substrate 15 extends beyond the active region. Referring to FIG. 2B, the flip chip LED 10 includes a cathode (e.g., first electrical contact) 61 and an anode (e.g., second electrical contact) 62 arranged along a lower surface 54. In certain embodiments, the cathode 61 includes length and width dimensions of about 95 μm by 140 μm, and the anode 62 includes length and width dimensions of about 70 μm by 170 μm.

FIGS. 3A and 3B are plan view photographs of a pixelated-LED chip including an array of four flip chip LEDs 10 formed on a single transparent substrate 15, with each flip chip LED 10 being substantially similar in structure and operation to the flip chip LED 10 of FIG. 1. Each flip chip LED 10 includes an active layer portion of an active layer. The active layer portion of each flip chip LED 10 is spaced apart from the active area of each adjacent flip chip LED 10 by a gap (e.g., 40 μm in a length direction and 30 μm in a width direction). A central portion of each gap embodies a street 70 (e.g., having a width of about 10 μm) consisting solely of the substrate 15, whereas peripheral portions of each gap (between each street 70 and active areas of LEDs 10) includes the substrate 15 as well as passivation material (e.g., the passivation layer 50 shown in FIG. 1). Each street 70 thus represents a boundary between adjacent flip chip LEDs 10. Each flip chip LED 10 includes a cathode 61 and an anode 62 arranged along a lower surface 54, and each flip chip LED 10 is arranged to emit light through an outer major surface 11 of the substrate 15. The exposed cathodes 61 and anodes 62 permit separate electrical connections to be made to each flip chip LED 10, such that each flip chip LED 10 may be individually addressable and independently electrically accessed. Additionally, this allows groups or subgroups of the flip chip LEDs 10 to be accessed together, separately from other flip chip LEDs 10. If it were desired to separate the flip chip LEDs 10 from one another, then a conventional method to do so would be to utilize a mechanical saw to cut through the streets 70 to yield individual flip chip LEDs 10.

FIGS. 4A and 4B are plan view photographs of a pixelated-LED chip including an array of one hundred flip chip LEDs 10 on a single transparent substrate 15, with each flip chip LED 10 being substantially similar in structure and operation to the flip chip LED 10 illustrated in FIG. 1. The flip chip LEDs 10 are separated from one another by gaps including streets 70. Each flip chip LED 10 includes an outer major surface 11 arranged for extraction of LED emissions, and includes a cathode 61 and an anode 62 arranged along a lower surface 54. The exposed cathodes 61 and anodes 62 permit separate electrical connections to be made to each flip chip LED 10, such that each flip chip LED 10 may be individually addressable and independently electrically accessed.

In certain embodiments, each flip chip LED of an array of LEDs supported by a single substrate (e.g., a pixelated-LED chip) includes a greatest lateral dimension of no greater than about 400 μm, about 300 μm, or about 200 μm. In certain embodiments, each flip chip LED pixel of an array of LEDs supported by a single substrate includes inter-pixel spacing of no greater than about 60 μm, or about 50 μm, or about 40 μm, or about 30 μm, or about 20 μm, or about 10 μm. Such dimensional ranges provide a desirably small pixel pitch.

In certain embodiments, a pixelated-LED chip includes LEDs serving as pixels each having a substantially square shape. In certain embodiments, a pixelated-LED chip includes LEDs serving as pixels each having a rectangular (but non-square) shape. In other embodiments, LEDs may be provided as pixels having hexagonal shapes, triangular shapes, round shapes, or other shapes.

In certain embodiments, a pixelated-LED chip may include LEDs provided in a two-dimensional array as pixels of about 70 μm long×70 μm wide, each including an active region of about 50 μm long×50 μm wide, thereby providing a ratio of emitting area to total area of 0.0025 mm$^2$/0.0049 mm$^2$=0..51 (or 51%). In certain embodiments, an array of at least 100 LEDs (as shown in FIG. 4B) may be provided in an area of no greater than 32 mm long×24 mm wide, with spacing between LEDs (pixel pitch) of no greater than 40 μm in the length direction and no greater than 30 μm in the width direction. In certain embodiments, each LED may include an emissive area of 280 μm long×210 μm wide (totaling an area of 0.0588 mm$^2$). Considering a total top area of 320 μm long×240 μm wide (totaling an area of 0.0768 mm$^2$) for each LED, a ratio of emissive area to total area (i.e., including emissive area in combination with non-emissive area) along a major (e.g., top) surface is 76.6%. In certain embodiments, a light emitting device as disclosed herein includes a ratio of emissive area to non-emissive (or dark) area along a major (e.g., top) surface of at least about 30%, at least about 40%, at least about 50% (i.e., about 1:1 ratio of emitting area to non-emitting (dark) area), at least about 55%, at least about 60%, at least about 65%, at least about 70%, at least about 75%, or at least about 80%. In certain embodiments, one or more of the foregoing values may optionally constitute a range bounded by an upper value of no greater than 70%, 75%, 80%, 85%, or 90%. In certain embodiments, an array of at least 1000 LEDs may be provided.

Although FIGS. 2A, 2B, 3A, 3B, 4A, and 4B show each LED 10 as including two n-contact vias (embodying vertically offset circles registered with the n-contact or cathode 61), in certain embodiments, n-contacts and any associated n-contact vias may be shifted laterally and provided in a dark area outside the emitting area of each LED 10.

As noted previously, the omnidirectional character of LED and phosphor emissions may render it difficult to prevent emissions of one LED (e.g., a first pixel) from significantly overlapping emissions of another LED (e.g., a second pixel) of an array of flip chip LEDs arranged on a single light-transmissive substrate. A single transparent substrate supporting multiple flip chip LEDs would permit light beams to travel in numerous directions, leading to light scattering and loss of pixel-like resolution of emissions transmitted through the substrate. Problems of light scattering and loss of pixel-like resolution would be further exacerbated by presence of one or more lumiphoric materials overlying the light extraction surface of a substrate, owing to the omnidirectional character of lumiphor emissions. Various embodiments disclosed herein address this issue by providing light segregation elements configured to reduce interaction between emissions of different LEDs and/or lumiphoric material regions, thereby reducing scattering and/or optical crosstalk and preserving pixel-like resolution of the resulting emissions. In this manner, light segregation elements as described herein may additionally provide strong contrast and/or sharpness between lit and unlit regions of LED arrays. In certain embodiments, exemplary light segregation elements may extend from a light injection surface into a substrate, may extend from a light extraction surface into a substrate, may extend outward from a light extraction surface, or any combination of the foregoing. In certain embodiments, multiple light segregation elements may be defined by different methods in the same substrate and/or light emitting device. In certain embodiments, light segregation elements of different sizes and/or shapes may be provided in the same substrate and/or light emitting device. For example, in certain embodiments, a first group of light segregation elements having a first size, shape, and/or fabrication technique may extend from a light injection surface into an interior of a substrate, and a second group of light segregation elements having a second size, shape, and/or fabrication technique may extend from the light injection surface into the interior of the substrate, wherein the second size, shape, and/or fabrication technique differs from the first size, shape, and/or fabrication technique. In certain embodiments, light segregation elements may include recesses (whether filled or unfilled) defined in a substrate supporting multiple LEDs, with such recesses embodying boundaries between pixels.

In certain embodiments, an underfill material is arranged between pixels of a pixelated-LED chip to form light segregation elements. In some embodiments, the underfill material comprises $TiO_2$ particles suspended in a silicone binder. In certain embodiments, a weight ratio of $TiO_2$ to silicone is in a range of 50% to 150%. In some embodiments, the weight ratio of $TiO_2$ to silicone is about 100%, or about 1:1. Additionally, a solvent may be added to alter the viscosity of the underfill material to improve flow and filling between pixels. The underfill material may comprise metallic particles suspended in an insulating binder. In certain embodiments, the underfill material comprises a dielectric material. In other embodiments, the underfill material comprises air. In certain embodiments, the underfill material comprises a material with a high durometer on a Shore hardness scale (e.g., a high durometer silicone material). A material with a high durometer value, or hardness, in the underfill material provides mechanical stability or anchoring of pixels of the pixelated-LED chip.

For example, the underfill material may comprise a material, such as silicone, with a Shore D hardness scale durometer value of at least 40. In further embodiments, the underfill material may comprise a material with a Shore D hardness scale durometer value in a range of from about 40 to about 100 or in a range from about 60 to about 80.

FIG. 5 is an upper perspective view photograph of a portion of a pixelated-LED light emitting device 72 with an underfill material 73 according to some embodiments, showing a plurality of pixels A1, A2, B1, and B2. Alphanumeric column labels A and B appear at top between vertical dashed lines, and Arabic numerals 1 and 2 appear at left between horizontal dashed lines to provide column and row references for individual pixels. The vertical and horizontal dashed lines correspond to street-aligned cut lines or regions 74-1 to 74-6 that define lateral borders and inter-pixel spaces between the pixels A1, A2, B1, and B2. Dashed lines extending outward beyond the image represent extensions of boundaries between pixels. The vertical and horizontal solid lines correspond to cut lines or regions 76-1 to 76-8 that are not aligned with streets between pixels. In certain embodiments, the cut lines or regions 76-1 to 76-8 are provided to form a patterned surface to promote extraction of light from each pixel. The underfill material 73 is configured along the lateral borders of each pixel A1, A2, B1, B2 for improved contrast. The width of the street-aligned cut lines 74-1 to 74-6 forms at least a portion of the spacing between pixels. In certain embodiments, each pixel A1, A2, B1, B2 of the pixelated-LED light emitting device 72 is spaced from adjacent pixels by a distance no greater than about 60 µm, or about 50 µm, or about 40 µm, or about 30 µm, or about 20 µm, or about 10 µm, or in a range of from about 10 µm to about 30 µm, or in a range of from about 10 µm to about 20 µm. Such dimensional ranges provide a desirably small pixel pitch. The spacing between pixels also relates to the width of the underfill material 73 that is configured between adjacent pixels. For example, in some embodiments, a 25 µm spacing between pixels allows more of the underfill material 73 (about 25 µm width) to be configured between adjacent pixels than a pixel spacing of 20 µm. Accordingly, more light may be reflected and redirected out of each pixel without leaking into an adjacent pixel by the underfill material 73 with 25 µm spacing compared to the underfill material 73 with 20 µm spacing, thereby providing improved contrast and pixel brightness. Notably, for a constant spacing between the street-aligned cut lines 74-1 to 74-6, a pixel spacing of 25 µm reduces the area of each pixel; however, the increase in the underfill material 73 may still provide brighter pixels with improved contrast.

The cut lines 76-1 to 76-8 form a plurality of light extraction surface recesses 78 that intersect and segregate a plurality of protruding features 80. For example, in the pixel A1, the vertical cut lines 76-1 and 76-2 and the horizontal cut lines 76-5 and 76-6 form two vertical and two horizontal light extraction surface recesses 78 that intersect and define nine protruding features 80. The shape of a cutting tool as well as the number and direction of cut lines defines the shape of the protruding features 80. In FIG. 5, the cut lines 76-1 to 76-4 are evenly spaced vertical lines that intersect with evenly spaced and orthogonal horizontal cut lines 76-5 to 76-8, and are formed with a beveled cutting tool. Accordingly, the protruding features 80 comprise square-base pyramidal shapes. In some embodiments, the pyramidal shapes comprise truncated pyramidal shapes, wherein such truncation may be vertical, lateral, or both vertical and lateral in character. Other shapes are possible, including triangle-shaped features, extruded triangle-shaped features and cuboid-shaped features. In other embodiments, the cut lines 76-1 to 76-8 may comprise intersecting diagonal lines to form other shapes, such as diamond-shaped features or other polyhedral features.

In certain embodiments, inter-pixel spaces are provided between adjacent pixels in a pixelated-LED chip. Inter-pixel spaces are formed when individual pixels are defined within a pixelated-LED chip and may include spaces between various elements of adjacent pixels, including active layer portions, substrate portions, and electrical contacts, among others. In certain embodiments, an underfill material is arranged in the inter-pixel spaces to cover all lateral surfaces between adjacent pixels. Additionally, the underfill material may substantially fill entire inter-pixel spaces between adjacent pixels. In certain embodiments, the electrical contacts for each pixel include an anode and a cathode and the underfill material is additionally arranged between the anode and cathode of each pixel.

FIGS. 6A-6J are schematic cross-sectional views of various states of fabrication of a pixelated-LED chip that includes an underfill material arranged in inter-pixel spaces between adjacent pixels. In FIG. 6A, an LED structure 82 including an active layer 84 has been deposited on a substrate 86. The LED structure 82 may include a plurality of epitaxial layers deposited by metal organic chemical vapor deposition (MOCVD). In addition to the active layer 84, the LED structure 82 may further include one or more n-type semiconductor layers and one or more p-type semiconductor layers. In some embodiments, the LED structure 82 includes Group III-V nitrides including but not limited to GaN, aluminum gallium nitride (AlGaN), aluminum indium gallium nitride (AlInGaN), and indium gallium nitride (InGaN). An exemplary n-type dopant is Si and an exemplary p-type dopant is magnesium (Mg). The active layer 84 may be configured between at least one n-type layer and one p-type layer. The active layer 84 may include a single quantum well (SQW) structure that includes a layer of InGaN or a multiple quantum well (MQW) structure such as a plurality of layers that include alternating layers of InGaN and GaN. Other semiconductor materials are possible, including gallium arsenide (GaAs), gallium phosphide (GaP), and alloys thereof. The substrate 86 may include a light-transmissive material such as SiC or sapphire, although other substrate materials are possible.

In FIG. 6B, a plurality of active layer portions 84-1 to 84-3 have been formed from the LED structure 82. A plurality of recesses or streets 88 are configured to segregate the active layer portions 84-1, 84-2, and 84-3. The plurality of recesses 88 may be formed by selectively etching portions of the LED structure 82. In some embodiments, the plurality of recesses 88 extends entirely through the active layer 84 and less than an entire thickness of an n-type layer that is between the active layer 84 and the substrate 86. In certain embodiments, an etching step is applied to the LED structure 82 to form the plurality of active layer portions 84-1 to 84-3. In FIG. 6C, electrical contacts that include an anode 90 and a cathode 92 are deposited over each of the active layer portions 84-1 to 84-3 to form a plurality of anode-cathode pairs 90, 92.

Figure 6E:
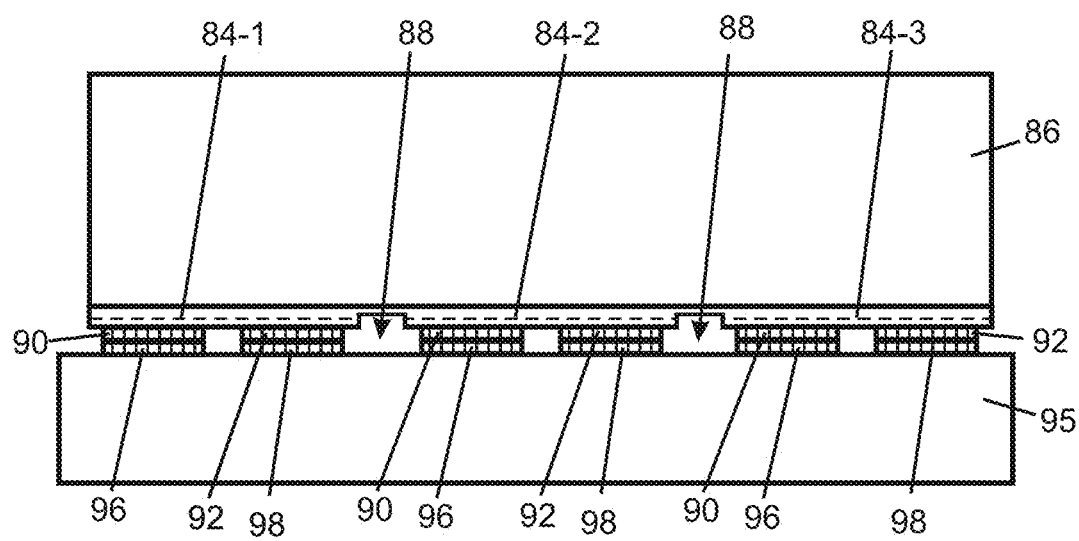

In FIG. 6D and FIG. 6E, the substrate 86 is flip-chip mounted over a mounting surface 94. In some embodiments, the mounting surface 94 is a surface of a submount 95 that includes a plurality of electrode pairs 96, 98. The submount 95 may comprise an active interface element such as an ASIC chip, a passive interface element that serves as an intermediate element that may be later-attached to an active interface element, or a temporary interface element that provides temporary support for subsequent manufacturing steps. For embodiments where the submount 95 comprises a temporary interface element, the plurality of electrode pairs 96, 98 may be omitted. The flip-chip mounting comprises establishing electrically conductive paths between the plurality of anode-cathode pairs 90, 92 and the plurality of electrode pairs 96, 98. In some embodiments, the plurality of anode-cathode pairs 90, 92 are planarized before flip-chip mounting to correct any variations in thicknesses from the anode-cathode deposition. Such planarization helps ensure that reliable electrical contacts may be made across the electrode pairs 96, 98 distributed across the entire interface between the submount 95 and the substrate 86, and avoids variation in interfacial height that would otherwise promote cracking of the substrate 86 when the substrate 86 is mechanically processed (e.g., thinned and shaped) in subsequent steps. The submount 95 may include a plurality of separate electrical paths, including one electrical path for each electrode pair of the plurality of electrode pairs 96, 98. In this regard, each of the active layer portions 84-1 to 84-3 may be independently electrically accessible. Additionally, this allows a group or subgroup of the active layer portions (e.g., 84-1 and 84-2) to be accessed together, independently of other active layer portions (e.g., 84-3). Any suitable material and/or technique (e.g., solder attachment, preform attachment, flux or no-flux eutectic attachment, silicone epoxy attachment, metal epoxy attachment, thermal compression attachment, bump bonding, and/or combinations thereof) can electrically connect the plurality of anode-cathode pairs 90, 92 and the plurality of electrode pairs 96, 98. In some embodiments, residue from the mounting step may be left in undesired areas between the substrate 86 and the submount 95 (such as in the recesses or streets 88), and a cleaning step (such as an ultrasonic clean), may be used to remove the residue.

In FIG. 6F, the substrate 86 may be subjected to one or more thinning processes such as etching, grinding, lapping, mechanical polishing, chemical polishing, chemical-mechanical polishing, and the like. In some embodiments, the substrate 86 may initially comprise a thickness of greater than 300 μm. After mounting the substrate 86 to the submount 95, the substrate 86 may be thinned to a thickness of no more than 100 μm. In some embodiments, the substrate 86 may be thinned to about 50 μm by one or more thinning steps. In certain embodiments, multiple thinning steps may be performed in increments of 20-80 μm per thinning step.

As illustrated in FIG. 6G, the substrate (86 of FIG. 6F) is separated along various cut lines or regions 100. In certain embodiments, the separation is performed with a rotary saw along the various cut lines or regions 100 at a high rotation speed but a slow linear travel speed to prevent cracking of crystalline substrate material. The cut lines or regions 100 are aligned with the plurality of recesses or streets 88 that segregate the active layer portions 84-1 to 84-3, thereby providing a "street-aligned" configuration. Notably, the cut lines or regions 100 intersect with the plurality of recesses or streets 88, such that portions of the substrate 86 that are registered with the plurality of recesses or streets 88 are removed through an entire thickness of the substrate 86. The substrate 86 is thereby segregated into a plurality of discontinuous substrate portions 86-1 to 86-3 that are registered with corresponding active layer portions 84-1 to 84-3 to form a pixelated-LED chip 102 comprising a plurality of pixels 104a, 104b, and 104c. As illustrated, inter-pixel spaces 106-1,106-2 are provided or formed between adjacent ones of the plurality of pixels 104a, 104b, and 104c. For example, the inter-pixel space 106-1 is provided between the pixels 104a and 104b. In this regard, the inter-pixel space 106-1 is formed between lateral surfaces of adjacent substrate portions 86-1, 86-2, between lateral surfaces of adjacent active layer portions 84-1, 84-2, between lateral surfaces of the cathode 92 of the pixel 104a and the anode 90 of the pixel 104b, and between lateral surfaces of the electrode 98 that is registered with the pixel 104a and the electrode 96 that is registered with the pixel 104b.

In FIG. 6H, an underfill material 108 has been applied between the substrate portions 86-1 to 86-3 and the submount 95 of the pixelated-LED chip 102. The underfill material 108 fills the inter-pixel spaces 106-1,106-2 as well as filling open spaces between the plurality of anode-cathode pairs 90, 92 that are bonded to the plurality of electrode pairs 96, 98. In this manner, the underfill material 108 may be arranged to cover various lateral surfaces between the pixels 104a to 104c, including lateral surfaces of adjacent substrate portions 86-1 to 86-3, lateral surfaces of adjacent active layer portions 84-1 to 84-3, lateral surfaces between the anode-cathode pairs 90, 92 of adjacent pixels 104a to 104c, and lateral surfaces between the electrode pairs 96, 98 that are registered with the adjacent pixels 104a to 104c. In certain embodiments, the underfill material 108 is arranged in the inter-pixel spaces 106-1, 106-2 to cover all lateral surfaces between the adjacent pixels 104a to 104c. In certain embodiments, the substrate portions 86-1 to 86-3 are spaced from each other by a distance no greater than about 60 82 m, or about 50 µm, or about 40 µm, or about 30 µm, or about 20 µm, or about 10 µm, or in a range of from about 10 µm to about 30 µm, or in a range of from about 10 µm to about 20 µm. Accordingly, a width of the underfill material 108 between the substrate portions 86-1 to 86-3 would have the same dimensions. By segregating the plurality of discontinuous substrate portions 86-1 to 86-3 before application of the underfill material 108, the underfill material 108 may be directly applied or dispensed to the inter-pixel spaces 106-1, 106-2 from the top of the pixelated-LED chip 102 as indicated by arrows 109 in FIG. 6H. In this manner, the underfill material 108 may more evenly cover the various lateral surfaces in the inter-pixel spaces 106-1, 106-2. Additionally, the underfill material 108 will have less distance to flow to reach and fill the areas between the anode-cathode pairs 90, 92 and the electrode pairs 96, 98 of each pixel 104a-104c. In further embodiments, the underfill material 108 may additionally be applied to the sides or lateral edges of the pixelated-LED chip 102 between the pixels 104a to 104c and the submount 95 as indicated by the arrows 109'. In certain embodiments, residue from thinning and sawing processes may be left in undesired areas between the substrate portions 86-1 to 86-3 and the submount 95 and in the inter-pixel spaces 106-1, 106-2. Before applying the underfill material 108, a cleaning step (such as an ultrasonic clean), may be used to remove the residue. In certain embodiments, the underfill material 108 may be applied under a vacuum to assist filling of certain areas, such as the areas between the anode-cathode pairs 90, 92 and the electrode pairs 96, 98 of each pixel 104a to 104c.

In certain embodiments, the underfill material 108 comprises an insulating material. The underfill material 108 may comprise a light-altering material, such as light-altering particles suspended in an insulating binder or a matrix. The light-altering material may include a material or particles that are configured to reflect, refract, or otherwise redirect light, or even absorb light generated from the active layer portions 84-1 to 84-3. In certain embodiments, the light-altering material may include combinations of different light-altering materials, such as light reflective or refractive particles suspended in the same binder as light-absorbing particles. The underfill material 108 may comprise $TiO_2$ particles suspended in a silicone binder. In certain embodiments, a weight ratio of $TiO_2$ to silicone is in a range of 50% to 150%. In certain embodiments, the weight ratio of $TiO_2$ to silicone is about 100%, or about 1:1. Additionally, a solvent may be added to alter a viscosity of the underfill material 108 to promote improved flow when filling the inter-pixel spaces 106-1, 106-2 and the open spaces between the plurality of anode-cathode pairs 90, 92. In other embodiments, the underfill material 108 may comprise metallic particles suspended in an insulating binder. In some embodiments, the underfill material 108 comprises a dielectric material. In other embodiments, the underfill material 108 comprises air. In this manner, the underfill material 108 is arranged in the inter-pixel spaces 106-1, 106-2 to form light segregation elements, or pixel segregation elements, between each of the active layer portions 84-1 to 84-3 and the substrate portions 86-1 to 86-3. Accordingly, light emissions of the active layer portions 84-1 to 84-3 may be segregated from each other, thereby having improved contrast.

In certain embodiments, the underfill material 108 may be configured with a reduced coefficient of thermal expansion (CTE). The submount 95 may comprise a material, such as Si, that has a low CTE. For example, some Si submounts may be configured with single digit CTE values in parts per million per degrees Celsius (ppm/° C.). If the underfill material 108 is configured with a CTE that has too large of a mismatch with the CTE of the submount 95, then the underfill material may detach from the submount 95 during subsequent curing steps. In certain embodiments, the underfill material 108 is configured with a CTE in a range from about 200 ppm/° C. to about 250 ppm/° C. In further embodiments, the underfill material 108 is configured with a CTE in a range from about 210 ppm/° C. to about 230 ppm/° C., or in a range from about 215 ppm/° C. to about 225 ppm/° C. Additionally, the underfill material 108 may comprise additional particles as previously described, such as $TiO_2$, which can significantly lower the CTE even further. In certain embodiments, a methyl group may be added to the underfill material 108 that may improve the ability of the underfill material 108 to withstand high light flux with reduced degradation, and serve to increase blocking of contaminates that may otherwise reach the active layer portions 84-1 to 84-3. In certain embodiments, the underfill material 108 comprises an index of refraction that is either closely matched or substantially matched with at least one of the active layer portions 84-1 to 84-3 or the substrate portions 86-1 to 86-3. In this manner, light from the active layer portions 84-1 to 84-3 that impinges the underfill 108 may more easily pass from the active layer portions 84-1 to 84-3 or the substrate portions 86-1 to 86-3 into the underfill material 108 before being redirected out of the pixelated LED chip 102.

In certain embodiments, the plurality of discontinuous substrate portions 86-1 to 86-3 are formed before the underfill material 108 is applied to the pixelated-LED chip 102. Accordingly, the inter-pixel spaces 106-1, 106-2 provide direct access between the pixels 104a to 104c. The underfill material 108 may be applied directly to the inter-pixel spaces 106-1, 106-2, rather than relying on a wicking action to spread the underfill material 108 from lateral edges of the pixelated-LED chip 102. The underfill material 108 may still wick around and between the anode-cathode pairs 90, 92 and the electrode pairs 96, 98. In addition to improving the contrast between the active layer portions 84-1 to 84-3, the underfill material 108 may additionally protect the integrity of the electrical connections between the plurality of anode-cathode pairs 90, 92 and the plurality of electrode pairs 96, 98. The underfill material 108 may further strengthen a mechanical interface between the substrate portions 86-1 to 86-3 and the submount 95 and between the adjacent pixels 104a to 104c during subsequent processing steps. In certain embodiments, the underfill material 108 comprises a material with a high durometer on a Shore hardness scale (e.g., a high durometer silicone material). A material with a high durometer, or hardness, in the underfill material 108 provides mechanical stability or anchoring to help prevent the plurality of anode-cathode pairs 90, 92 from detaching from the plurality of electrode pairs 96, 98 in subsequent processing steps or during operation. For example, the underfill material 108 may comprise a material, such as silicone, with a Shore D hardness scale durometer value of at least 40. In further embodiments, the underfill material 108 may comprise a material with a Shore D hardness scale durometer value in a range of from about 40 to about 100 or in a range from about 60 to about 80.

In FIG. 6I, the pixelated-LED chip 102 includes at least one lumiphoric material 110 (also referred to herein as a lumiphor). In particular, the lumiphoric material 110 is arranged on a light extraction surface 112 of each of the plurality of pixels 104a to 104c. As previously described, the lumiphoric material 110 may include one or more of a phosphor, a scintillator, a lumiphoric ink, a quantum dot material, a day glow tape, or the like. In certain embodiments, the lumiphoric material 110 may be in the form of one or more phosphors and/or quantum dots arranged in a binder such as silicone or glass, arranged in the form of a single crystalline plate or layer, a polycrystalline plate or layer, and/or a sintered plate. In certain embodiments, the lumiphoric material 110 may be spin coated or sprayed on a surface of the plurality of pixels 104a to 104c. In certain embodiments, the lumiphoric material 110 may be located on each of the plurality of discontinuous substrate portions 86-1 to 86-3. In some embodiments, the lumiphoric material 110 is continuous on the plurality of discontinuous substrate portions 86-1 to 86-3. In some embodiments, the lumiphoric material 110 is over-applied, and a removal process such as grinding is used to tune each pixel 104a to 104c to desired color points. In general, the plurality of active layer portions 84-1 to 84-3 may generate light having a first peak wavelength. At least one lumiphor receiving at least a portion of the light generated by the plurality of active layer portions 84-1 to 84-3 may re-emit light having a second peak wavelength that is different from the first peak wavelength. A solid state light source and one or more lumiphoric materials may be selected such that their combined output results in light with one or more desired characteristics such as color, color point, intensity, etc. In certain embodiments, aggregate emissions may be arranged to provide cool white, neutral white, or warm white light, such as within a color temperature range of from 2500 K to 10,000 K. In certain embodiments, a lumiphoric material comprises one or more materials including cyan, green, amber, yellow, orange, and/or red peak emission wavelengths. In certain embodiments, a scattering material may be included in the lumiphoric material 110. By way of example, the lumiphoric material 110 may include phosphor particles and scattering particles such as fused silica, fumed silica, or $TiO_2$ particles in the same silicone binder. In other embodiments, the scattering material may comprise a layer of fused silica, fumed silica, or $TiO_2$ particles in a silicone binder deposited sequentially on the lumiphoric material 110.

The lumiphoric material 110 may comprise a material with a lower durometer value on a Shore hardness scale than the underfill material 108. In some embodiments, the lumiphoric material 110 and the underfill material 108 comprise silicone, and the silicone of the lumiphoric material 110 has a lower durometer value on a Shore hardness scale than the silicone of the underfill material 108. As previously described, the underfill material 108 may comprise a silicone with a Shore D hardness durometer value of at least 40. In further embodiments, the underfill material 108 may comprise silicone with a Shore D hardness durometer value in a range from about 40 to about 100 or in a range from about 60 to about 80. In that regard, the lumiphoric material 110 comprises silicone with a Shore D hardness durometer value of less than 40 in some embodiments. In some embodiments, the underfill material 108 between each pixel of the plurality of pixels 104a to 104c may be omitted. Accordingly, an open space or an unfilled void of air may be provided between each pixel of the plurality of pixels 104a to 104c to form a light segregation element, or a pixel segregation element.

In FIG. 6J, the underfill material 108 has been applied to fill areas between the substrate portions 86-1 to 86-3 and the submount 95 of the pixelated-LED chip 102 in a manner similar to FIG. 6H. In this manner, the underfill material 108 may be arranged to cover various lateral surfaces between the pixels (104a to 104c of FIG. 6H). In certain embodiments, the underfill material 108 is arranged to only partially cover the lateral surfaces of the substrate portions 86-1 to 86-3 in the inter-pixel spaces 106-1, 106-2. In other embodiments, the underfill material 108 is arranged to cover the lateral surfaces of the active layer portions 84-1 to 84-3, but not the lateral surfaces of the substrate portions 86-1 to 86-3, as indicated by the alternate underfill material level 108' in FIG. 6J.

In some embodiments, the submount 95 of FIGS. 6A-6I may comprise a temporary carrier. Accordingly, the plurality of pixels 104a to 104c, the underfill material 108, and the lumiphoric material 110 may be separated or removed from the submount 95.

As previously described, a pixelated-LED chip may include a light-transmissive substrate or a plurality of discontinuous substrate portions that form light extraction surfaces of the pixelated-LED chip. Depending on the substrate material, the light extraction surfaces may include patterned, roughened, or textured surfaces to promote extraction of light. In certain embodiments related to manufacturing a pixelated-LED chip, it may be desirable to thin the substrate before mounting the substrate on a submount. In this manner, subsequent sawing steps have less substrate material to cut through to form the discontinuous substrate portions. After mounting a thinned substrate, a sawing step may also be used to form protruding features and light extraction surface recesses on the light extraction surfaces. In other embodiments, the thinned substrate may be textured, or micro-textured, with a chemical or mechanical process prior to mounting on a submount.

FIGS. 7A-7D are schematic cross-sectional views of various states of fabrication of a pixelated-LED chip that includes substrate portions with protruding features and light extraction surface recesses as well as an underfill material arranged in inter-pixel spaces. In FIG. 7A, the plurality of active layer portions 84-1 to 84-3 are segregated on the substrate 86 by the recesses or streets 88, and the anode-cathode pairs 90, 92 are provided on the plurality of active layer portions 84-1 to 84-3 as previously described. As illustrated, the substrate 86 is thinned before subsequent processing steps. In FIG. 7B, the substrate 86 that has been pre-thinned is then flip-chip mounted over the mounting surfaced 94 of the submount 95. In certain embodiments, the flip-chip mounting comprises establishing electrically conductive paths between the plurality of anode-cathode pairs 90, 92 and the plurality of electrode pairs 96, 98 as previously described.

In FIG. 7C, the substrate (86 of FIG. 7B) is separated along various cut lines or regions 100 to form the plurality of discontinuous substrate portions 86-1 to 86-3, the pixels 104a to 104c, and the inter-pixel spaces 106-1, 106-2 of a pixelated-LED chip 114. Each of the substrate portions 86-1 to 86-3 includes a light injection surface 115 adjacent corresponding active layer portions 84-1 to 84-3 and the light extraction surface 112 that generally opposes the light injection surface 115. The light injection surface 115 is arranged between the active layer portions 84-1 to 84-3 and the light extraction surface 112 of each pixel 104a to 104c . Additional cut lines or regions 116 form a plurality of light extraction surface recesses 118 that intersect and serve to define and segregate a plurality of protruding features 120 for each pixel 104a to 104c. More particularly, bevel cutting may be performed to yield a plurality of inclined lateral faces defined between the light extraction recesses 118 and the protruding features 120. In certain embodiments, each inclined lateral face comprises an angle of inclination from vertical in a range of from about 15 degrees to about 45 degrees, or in a subrange of from about 20 degrees to about 40 degrees, or in a subrange of from about 25 degrees to about 35 degrees, or in an amount of about 30 degrees. When an angle of inclination from vertical of about 30 degrees is used, and opposing faces of the protruding features 120 are formed by two bevel cuts of the same magnitude, the protruding feature 120 may include an angle of about 60 degrees between the opposing faces. With further reference to FIG. 7C, a lower boundary of each light extraction surface recess 118 may be radiused, reflecting the fact that a rotary saw blade useable to form each light extraction surface recess 118 has a non-zero thickness. In certain embodiments, the cut lines or regions 100 are formed first, followed by the cut lines or regions 116. In other embodiments, the order may be reversed such that the cut lines or regions 116 are formed before the cut lines or regions 100. In still further embodiments, the cut lines or regions 116 and 100 are formed sequentially across the pixelated-LED chip 114.

In FIG. 7D, the underfill material 108 as previously described has been applied between the substrate portions 86-1 to 86-3 and the submount 95 of the pixelated-LED chip 114. The underfill material 108 fills the inter-pixel spaces 106-1,106-2 as well as filling open spaces between the plurality of anode-cathode pairs 90, 92 that are bonded to the plurality of electrode pairs 96, 98. In this manner, the underfill material 108 may be arranged to cover various lateral surfaces between the pixels 104a to 104c, including lateral surfaces of the adjacent substrate portions 86-1 to 86-3, lateral surfaces of the adjacent active layer portions 84-1 to 84-3, lateral surfaces between the anode-cathode pairs 90, 92 of the adjacent pixels 104a to 104c, and lateral surfaces between the electrode pairs 96,98 that are registered with the adjacent pixels 104a to 104c. In certain embodiments, the underfill material 108 is arranged in the inter-pixel spaces 106-1, 106-2 to cover all lateral surfaces between the adjacent pixels 104a to 104c. In certain embodiments, a lumiphoric material may be applied as previously described. Additionally, the lumiphoric material could be formed with a shape that conforms to surfaces of the substrate portions 86-1 to 86-3, including the light extraction surface recesses (118 in FIG. 7C) and the protruding features (120 in FIG. 7C). The lumiphoric material may be conformally applied to the substrate portions 86-1 to 86-3 by conformal deposition or a molding process, or the lumiphoric material may be subjected to a removal process to form the desired shape.

FIGS. 8A-8E are schematic cross-sectional views of various states of fabrication of a pixelated-LED chip that includes substrate portions with textured surfaces as well as an underfill material arranged in inter-pixel spaces. In FIG. 8A, the plurality of active layer portions 84-1 to 84-3 are segregated on the substrate 86 by the recesses or streets 88, and the anode-cathode pairs 90, 92 are provided on the plurality of active layer portions 84-1 to 84-3 as previously described. As illustrated, the substrate 86 is thinned before subsequent processing steps. In FIG. 8B, the substrate 86 has been subject to a texturing or micro-texturing process to form a textured surface 122. In certain embodiments, the textured surface 122 may be formed by one or more etching steps, such as reactive ion etching and may include randomly textured features, patterned features, or combinations of randomly textured features and patterned features. The textured surface 122 may be formed by first polishing the substrate 86 with a diamond slurry, followed by reactive ion etching, or by reactive ion etching over a patterned photoresist material to form various patterns on the textured surface, or by reactive ion etching over a material that has undergone Ostwald ripening.

In certain embodiments, the textured surface 122 may comprise a plurality of microscale textural features. In certain embodiments, each microscale textural feature may have a maximum dimension (e.g., length, width, or height) of up to about 10 µm, or up to about 7.5 µm, or up to about 5 µm, or up to about 3 µm, or up to about 2 µm, or up to about 1 µm. In certain embodiments, microscale textural features may be defined by a subtractive material removal process, such as dry etching and/or wet etching. Examples of dry etching processes that might be used in certain embodiments include inductively coupled plasma etching and reactive ion etching.

In certain embodiments, microscale textural features may be randomly distributed (e.g., with large variation in spacing, optionally in combination with large variation in size, shape, and/or texture). In certain embodiments, microscale textural features may be regularly spaced and/or regularly sized. Such features may be formed through use of at least one mask with regularly spaced openings or pores, which may be defined by photolithographic patterning or other conventional mask formation methods.

In certain embodiments, a substrate (e.g., SiC) may be blanket coated with a thin coating (e.g., 200-300 Angstroms) of Al. A consumable water soluble template pre-coated with resist may be bonded to a coated wafer surface with low temperature and pressure. The template may be removed with warm water, leaving resist dots. The Al layer may be patterned with a short chlorine etch followed by a short (e.g., 20-60 second) inductively coupled plasma (ICP) etch to transfer the pattern into the SiC. A tetramethyl ammonium hydroxide (TMAH) wet etch may be used to remove any residual Al.

In certain embodiments, a pixelated LED chip may include combinations of microscale textural features illustrated in FIGS. 8A-8E and the protruding features as described for FIGS. 7A-7D.

In FIG. 8C, the substrate 86 that has been pre-thinned and includes the textured surface 122 has been flip-chip mounted over the mounting surfaced 94 of the submount 95 as previously described. In FIG. 8D, the substrate (86 of FIG. 8C) is separated to form the plurality of discontinuous substrate portions 86-1 to 86-3, the pixels 104a to 104c, and the inter-pixel spaces 106-1, 106-2 of a pixelated-LED chip 124. In FIG. 8E, the underfill material 108 as previously described has been applied between the substrate portions 86-1 to 86-3 and the submount 95 as well as in the inter-pixel spaces 106-1,106-2 of the pixelated-LED chip 124. In certain embodiments, a lumiphoric material may be applied as previously described.

In certain embodiments as disclosed herein, LED chips are configured with surfaces to promote improved wetting or wicking of underfill material. For pixelated-LED chips, this allows the underfill material to more easily cover all lateral surfaces of inter-pixel spaces. In certain embodiments, LED chips or individual pixels of a pixelated-LED chip include coatings or layers that are configured to comprise a contact angle with the underfill material that promotes improved wetting or wicking. In this regard, a pixelated-LED chip may include: an active layer comprising a plurality of active layer portions, wherein each active layer portion of the plurality of active layer portions is independently electrically accessible to form a plurality of pixels, wherein each pixel of the plurality of pixels includes electrical contacts, and inter-pixel spaces are provided between adjacent pixels of the plurality of pixels; an underfill material arranged in the inter-pixel spaces between adjacent pixels; and a wetting layer between the underfill material and the plurality of active layer portions, wherein the wetting layer comprises a contact angle with the underfill material of less than about 30 degrees.

FIG. 9 is a comparison plot illustrating contact angles between various wetting layer materials and an underfill material as previously described. In particular, a droplet of common underfill material that includes $TiO_2$ suspended in a silicone binder was placed on a variety of surface materials and the contact angle or wetting angle of each droplet was measured. The surface materials included aluminum oxide ($Al_2O_3$), GaN, a first $SiO_2$ material, a second $SiO_2$ material, SiC, SiN, Ti, and titanium oxynitride (TiON). The contact angles are measured in degrees from the surface material and, accordingly, lower contact angles indicate better wetting of the underfill material than higher contact angles. Notably, SiN, which is typically used as a passivation layer (e.g., 50 of FIG. 1) that is on a portion of an exterior sidewall of an LED, has a higher contact angle. This may reduce wetting of the underfill material, thereby providing uneven regions or voids in the underfill material between pixels in a pixelated-LED chip. As indicated, the first $SiO_2$ material ($SiO_2$-1), the second $SiO_2$ material ($SiO_2$-2), and the SiC demonstrated the lowest contact angles, or improved wetting or wicking of underfill material. In particular, the $SiO_2$-2 material demonstrated the lowest contact angle with values under about 30 degrees, or in a range including about 22 degrees to about 30 degrees. The $SiO_2$-2 material was deposited with a higher density or fewer voids than the $SiO_2$-1 material by adjusting the deposition conditions according to common manufacturing techniques for $SiO_2$. In certain embodiments, a wetting layer may be arranged on exterior surfaces of an LED chip or a pixel of a pixelated-LED chip with a contact angle with the underfill material in a range of about 0 degrees to about 30 degrees, or in a range of from about 22 degrees to about 30 degrees.

FIG. 10 illustrates a representative LED chip 126 that includes a wetting layer 128 configured to promote improved wetting or wicking of an underfill material. The LED chip 126 is illustrated as a flip-chip LED that is similar to the flip chip LED chip 10 of FIG. 1. In particular, the LED chip 126 includes the substrate 15, the internal light-transmissive surface 14, the first semiconductor layer 21, the second semiconductor layer 22, the active region 25, the mesa 29 that is laterally bounded by the at least one recess 39 containing part of the passivation layer 50 as previously described. The LED chip 126 additionally includes the multi-layer reflector arranged proximate to (e.g., on) the second semiconductor layer 22, with the multi-layer reflector consisting of the dielectric reflector layer 40 and the metal reflector layer 42 as previously described. In certain embodiments, the multi-layer reflector "wraps around" peripheral portions of the semiconductor layers 21, 22 (including the active region 25). In one embodiment, the first semiconductor layer 21 proximate to the substrate 15 embodies an n-doped material (e.g., n-GaN), and the second semiconductor layer 22 embodies a p-doped material (e.g., p-GaN). The at least one recess 39, which is vertically bounded by the surface extensions 21A of the first semiconductor layer 21, further may include peripheral "wrap-around" portions 40' of the dielectric layer 40. In this regard, the "wrap-around" portions 40' of the dielectric layer 40 are configured to reflect or redirect light from the active region 25 that may otherwise escape laterally from the LED chip 126 in an undesired emission direction. Within the at least one recess 39, the "wrap-around" portions 40' are peripherally bounded by passivation material of the passivation layer 50. As previously described, the passivation layer 50 may include moisture resistant SiN to prevent moisture to be drawn into contact with portions of the metal reflector layer 42 or the interlayer 55, which would be expected to lead to detrimental chemical interaction. The LED chip 126 further includes the wetting layer 128 on the passivation layer 50. As illustrated, the wetting layer 128 is arranged to peripherally bound the passivation layer 50 in the at least one recess 39. In this manner, the passivation layer 50 is configured as a moisture barrier while the wetting layer 128 provides a surface to promote wetting or wicking of underfill materials. Accordingly, the at least one recess 39 may include portion of the "wrap-around" portion 40' of the dielectric reflector 40, the passivation layer 50 and the wetting layer 128 that are sequentially configured to laterally or peripherally bound the mesa 29. In certain embodiments, the wetting layer 128 is configured to comprise a contact angle with the underfill material of less than about 30 degrees, or in a range of about 0 degrees to about 30 degrees, or in a range of about 22 degrees to about 30 degrees as previously described. In certain embodiments, the wetting layer 128 is compositionally different from the passivation layer 50. In certain embodiments, the wetting layer 128 comprises a dielectric material, such as $SiO_2$. The wetting layer 128 may also comprise a layer or coating of SiC, or TiON, among others. In certain embodiments, the wetting layer 128 may be arranged between the passivation layer 50 and the first and second externally accessible electrical contacts 61, 62.

Following formation of the passivation layer 50 and the wetting layer 128, the one or more side portions 16 extending between the outer major surface 11 of the substrate 15 and the surface extensions 21A of the first semiconductor layer 21 may not be covered with the passivation layer 50 and the wetting layer 128. Such side portions 16 embody non-passivated side surfaces. In certain embodiments, the side portions 16 and the wetting layer 128 are configured to both comprise a contact angle with an underfill material of less than about 30 degrees, or in a range of about 0 degrees to about 30 degrees, or in a range of about 22 degrees to about 30 degrees as previously described. In certain embodiments, the wetting layer 128 may also be configured to extend on and peripherally bound the one or more side portions 16 of the substrate 15.

Figure 11A:
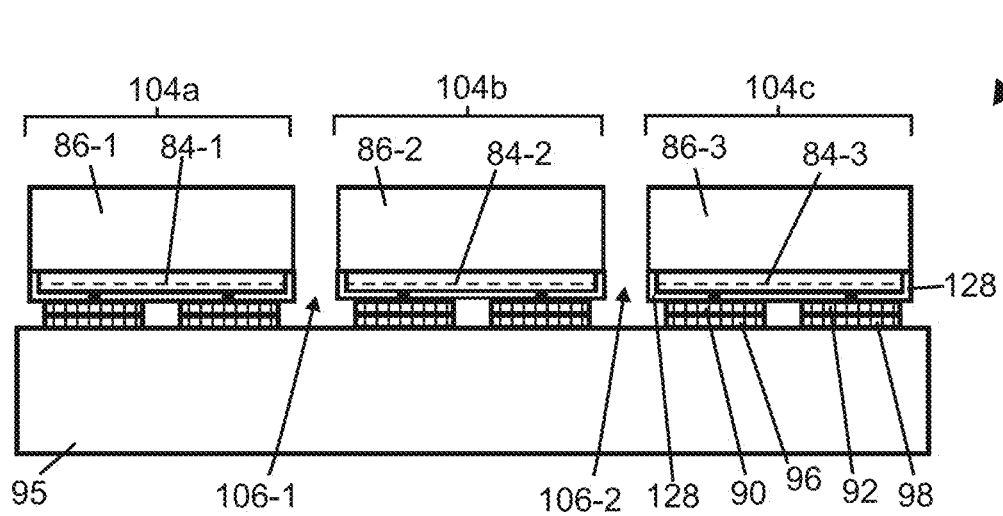
FIGS. 11A-11C are schematic cross-sectional views of various states of fabrication of a pixelated-LED chip that includes a wetting layer and an underfill material arranged in inter-pixel spaces between adjacent pixels.
Figure 11B:
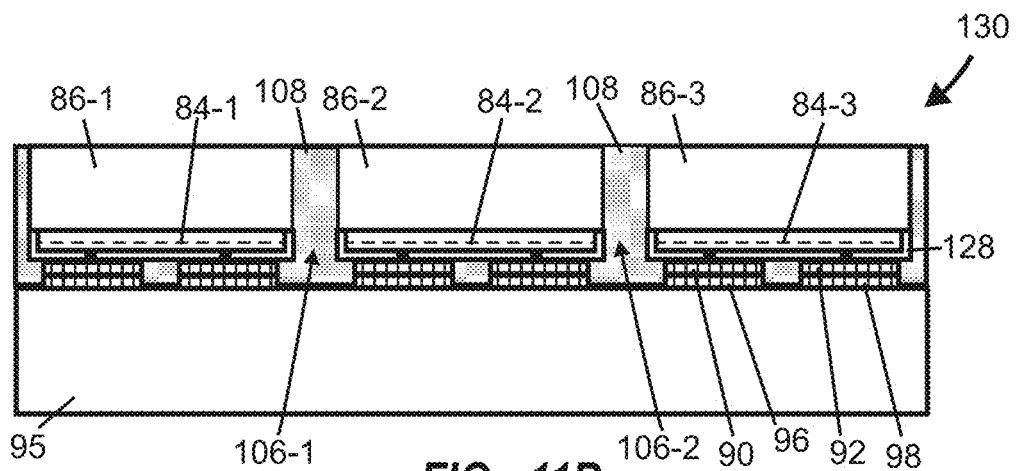
Figure 11C:
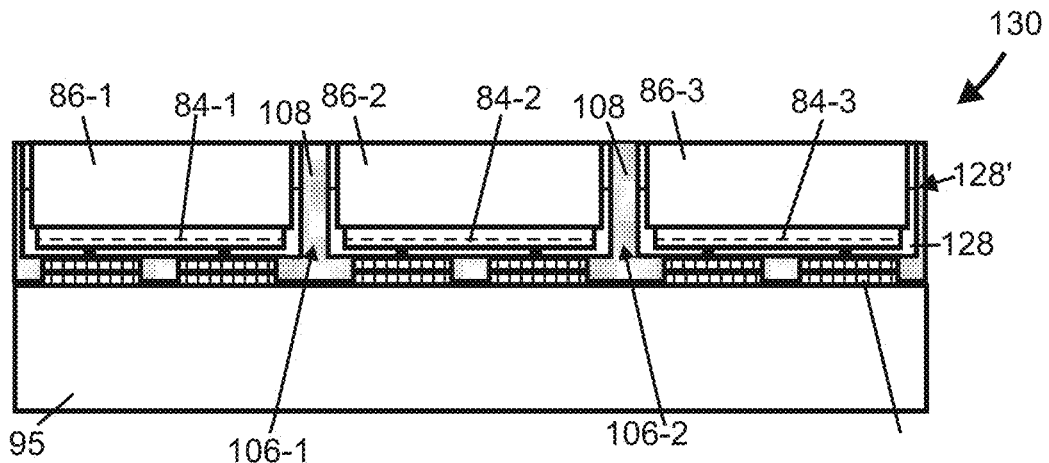

FIGS. 11A-11C are schematic cross-sectional views of various states of fabrication of a pixelated-LED chip that includes a wetting layer and an underfill material arranged in inter-pixel spaces between adjacent pixels. In FIG. 11A, a pixelated-LED chip 130 includes the active layer portions 84-1 to 84-3 and the substrate portions 86-1 to 86-3 that form the pixels 104a to 104c as previously described. Additionally, the pixels 104a to 104c are arranged in a flip-chip configuration with electrically conductive paths between the plurality of anode-cathode pairs 90, 92 and the plurality of electrode pairs 96, 98 of the submount 95. As illustrated, the wetting layer 128 is configured to at least peripherally bound the active layer portions 84-1 to 84-3. In this manner, the wetting layer 128 is configured to cover lateral surfaces of the active layer portions 84-1 to 84-3 and the mesa (29 of FIG. 10) of each pixel 104*a* to 104*c* that are adjacent the inter-pixel spaces 106-1, 160-2. As previously described, the passivation layer (50 of FIG. 10) may be arranged to laterally bound the mesa (29 of FIG. 10) of each pixel 104*a* to 104*c* . In this manner, the wetting layer 128 may be arranged to laterally bound the passivation layer (50 of FIG. 10) along the mesa (29 of FIG. 10) of each pixel 104*a* to 104*c* . In FIG. 11B, the underfill material 108 has been applied between the substrate portions 86-1 to 86-3 and the submount 95 of the pixelated-LED chip 130. The underfill material 108 fills the inter-pixel spaces 106-1,106-2 as well as filling open spaces between the plurality of anode-cathode pairs 90, 92 that are bonded to the plurality of electrode pairs 96, 98. In this manner, the underfill material 108 may be arranged to cover various lateral surfaces between the pixels 104*a* to 104*c* , including lateral surfaces of the adjacent substrate portions 86-1 to 86-3, lateral surfaces of the adjacent active layer portions 84-1 to 84-3, lateral surfaces between the anode-cathode pairs 90, 92 of the adjacent pixels 104*a* to 104*c* , and lateral surfaces between the electrode pairs 96, 98 that are registered with the adjacent pixels 104*a* to 104*c* . In certain embodiments, the underfill material 108 is arranged in the inter-pixel spaces 106-1, 106-2 to cover all lateral surfaces between the adjacent pixels 104*a* to 104*c* . In particular, the underfill material 108 is arranged to cover the wetting layer 128 that peripherally bounds the active layer portions 84-1 to 84-3 as well as the portions of the wetting layer 128 that are between the anode-cathode pairs 90, 92 of each pixel 104*a* to 104*c* . In this manner, the underfill material 108 may flow more easily to fill the inter-pixel spaces 106-1, 106-2 and the surfaces between the anode-cathode pairs 90, 92 of the adjacent pixels 104*a* to 104*c* with reduced voids in the underfill material 108.

FIG. 11C is a schematic cross-sectional view of a pixelated-LED chip 130 with alternative configurations of the wetting layer 128 of FIG. 11B. As illustrated, the wetting layer 128 may be configured to at least peripherally bound the active layer portions 84-1 to 84-3 and at least a portion of the substrate portions 86-1 to 86-3. In particular, the wetting layer 128 may be configured to laterally bound substantially all of each lateral edge of the substrate portions 86-1 to 86-3. Accordingly, the wetting layer 128 is arranged entirely between the underfill material 108 and each of the substrate portions 86-1 to 86-3 in the inter-pixel spaces 106-1, 106-2. In other embodiments, the wetting layer 128 may be configured to laterally bound the active layer portions 84-1 to 84-3 and only portions of each lateral edge of the substrate portions 86-1 to 86-3, as indicated by an alternative wetting layer level 128' in FIG. 11C. In this manner, the wetting layer 128 is arranged partially between the underfill material 108 and each pixel (104*a* to 104*c* of FIG. 11A) in the inter-pixel spaces 106-1, 106-2. When the wetting layer 128 is arranged to partially bound lateral edges of each of the substrate portions 86-1 to 86-3, the remainder of each of the lateral edges may be filled with the underfill material 108. In certain embodiments, a lumiphoric material may be applied as previously described.

FIGS. 12A-12C are schematic cross-sectional views of various states of fabrication of a pixelated-LED chip that includes a wetting layer and an underfill material that has been arranged in inter-pixel spaces before discontinuous substrate portion are formed. In FIG. 12A, the active layer portions 84-1 to 84-3 of a pixelated-LED chip 132 have been formed on the substrate 86, and the substrate 86 has been flip-chip mounted on the submount 95 to form electrically conductive paths between the plurality of anode-cathode pairs 90, 92 and the plurality of electrode pairs 96, 98. As illustrated, the wetting layer 128 is configured to at least peripherally bound the active layer portions 84-1 to 84-3 as previously described. The active layer portions 84-1 to 84-3 form the plurality of pixels 104*a* to 104*c* on a continuous portion of the substrate 86. In FIG. 12B, the underfill material 108 has been applied between the substrate 86 and the submount 95 of the pixelated-LED chip 132. The underfill material 108 fills the inter-pixel spaces 106-1,106-2 as well as filling open spaces between the plurality of anode-cathode pairs 90, 92 that are bonded to the plurality of electrode pairs 96, 98. In FIG. 12B, the substrate 86 is continuous over the active layer portions 84-1 to 84-3 and, accordingly, the underfill material 108 is applied along a perimeter of the pixelated-LED chip 132 between the substrate 86 and the submount 95. A wicking action and a capillary action allows the underfill material 108 to fill the inter-pixel spaces 106-1,106-2 and the spaces between the plurality of anode-cathode pairs 90, 92. The wetting layer 128 provides improved flow and wicking by reducing surface energy with the underfill material 108 to provide the underfill material 108 in these spaces with reduced voids or bubbles. In certain embodiments, a pressure or a vacuum is applied to the pixelated-LED chip 132 to assist the wicking and capillary action of the underfill material 108. In FIG. 12C, the discontinuous substrate portions 86-1 to 86-3 have been formed in the pixelated-LED chip 132 after the underfill material 108 has been formed. In this manner, the underfill material 108 may only partially cover lateral surfaces of the substrate portions 86-1 to 86-3. In certain embodiments, an additional material that may be the same material or different than the underfill material 108 may be applied in the inter-pixel spaces 106-1, 106-2 to substantially cover the remaining lateral surfaces of the substrate portions 86-1 to 86-3. In certain embodiments, a lumiphoric material may be applied as previously described.

Those skilled in the art will recognize improvements and modifications to the preferred embodiments of the present disclosure. All such improvements and modifications are considered within the scope of the concepts disclosed herein and the claims that follow.

What is claimed is:

1. A pixelated light emitting diode (LED) chip comprising:
   an active layer comprising a plurality of active layer portions, wherein the plurality of active layer portions forms a plurality of pixels, wherein each pixel of the plurality of pixels includes electrical contacts, and inter-pixel spaces are provided between adjacent pixels of the plurality of pixels; and
   an underfill material arranged in the inter-pixel spaces to cover all lateral surfaces between the adjacent pixels.

2. The pixelated-LED chip of claim 1, wherein the electrical contacts of each pixel comprise an anode and a cathode, and the underfill material is further arranged between the anode and the cathode of each pixel of the plurality of pixels.

3. The pixelated-LED chip of claim 1, wherein the underfill material comprises a light-altering or a light-reflecting material.

4. The pixelated-LED chip of claim 3, wherein the light-altering or light-reflecting material comprises light-altering or light-reflecting particles suspended in a binder.

5. The pixelated-LED chip of claim 4, wherein the light-altering or light-reflecting particles comprise titanium dioxide ($TiO_2$) particles and the binder comprises silicone.

6. The pixelated-LED chip of claim 1, further comprising a substrate comprising a plurality of discontinuous substrate portions supporting the plurality of active layer portions, wherein each substrate portion comprises a light-transmissive material.

7. The pixelated-LED chip of claim 6, wherein the plurality of discontinuous substrate portions comprises silicon carbide (SiC) or sapphire.

8. The pixelated-LED chip of claim 6, wherein each substrate portion comprises a light injection surface and a light extraction surface, wherein the light injection surface is arranged between the active layer and the light extraction surface and the light extraction surface of each substrate portion comprises a plurality of protruding features and a plurality of light extraction surface recesses.

9. The pixelated-LED chip of claim 6, wherein each substrate portion comprises a light injection surface and a light extraction surface, wherein the light injection surface is arranged between the active layer and the light extraction surface, and the light extraction surface of each substrate portion comprises a textured surface.

10. The pixelated-LED chip of claim 1, further comprising a lumiphoric material on the plurality of pixels.

11. A method for fabricating a pixelated light emitting diode (LED) lighting device comprising:
    forming an LED structure on a substrate, wherein the LED structure comprises an n-type layer, a p-type layer, and an active layer therebetween;
    defining a plurality of recesses or streets through the active layer to form a plurality of active layer portions, wherein the plurality of recesses or streets are defined to a depth that extends through less than an entire thickness of the n-type layer;
    removing portions of the substrate through an entire thickness of the substrate along a plurality of regions registered with the plurality of recesses or streets to form a plurality of discontinuous substrate portions; and
    applying an underfill material between adjacent active layer portions and between adjacent substrate portions.

12. The method of claim 11, further comprising forming a plurality of anode-cathode pairs in conductive electrical communication with the plurality of active layer portions, and wherein said applying the underfill further comprises applying the underfill between an anode and a cathode of each anode-cathode pair.

13. The method of claim 11, further comprising forming a plurality of protruding features and a plurality of light extraction surface recesses on a light extraction surface of each of the substrate portions.

14. The method of claim 11, further comprising texturizing a light extraction surface of each of the substrate portions.

15. The method of claim 14, wherein said texturizing the light extraction surface of each of the substrate portions comprises texturizing a surface of the substrate before forming the plurality of discontinuous substrate portions.

16. The method of claim 11, further comprising depositing a wetting layer on sidewalls of the plurality of active layer portions before applying the underfill material, wherein the underfill material comprises a contact angle with a passivation layer of less than about 30 degrees.

17. The method of claim 11, wherein applying the underfill material comprises applying the underfill material between the discontinuous substrate portions from the top of the pixelated LED chip.

18. The method of claim 17, wherein applying the underfill material further comprises applying the underfill material to lateral edges of the pixelated LED chip.

19. A pixelated light emitting diode (LED) chip comprising:
    a plurality of pixels, wherein each pixel of the plurality of pixels includes: semiconductor layers that form a mesa, a passivation layer on the semiconductor layers and laterally bounding the mesa, and electrical contacts, and wherein inter-pixel spaces are provided between adjacent pixels of the plurality of pixels;
    an underfill material arranged in the inter-pixel spaces between the adjacent pixels; and
    a wetting layer arranged between the underfill material and the passivation layer of each pixel, wherein the wetting layer is arranged to laterally bound the passivation layer along the mesa of each pixel.

20. The pixelated-LED chip of claim 19, wherein the electrical contacts of each pixel comprise an anode and a cathode, and the wetting layer is further arranged between the anode and the cathode of each pixel of the plurality of pixels.

21. The pixelated-LED chip of claim 19, wherein the wetting layer is compositionally different from the passivation layer.

22. The pixelated-LED chip of claim 19, wherein the wetting layer comprises silicon dioxide and the passivation layer comprises silicon nitride.

23. The pixelated-LED chip of claim 19, wherein the wetting layer comprises a contact angle with the underfill material of less than about 30 degrees.

24. The pixelated-LED chip of claim 19, wherein each of the plurality of pixels further comprises a substrate supporting the semiconductor layers, and wherein the wetting layer is arranged entirely between the underfill material and the substrate of each pixel.

25. The pixelated-LED chip of claim 19, wherein each of the plurality of pixels further comprises a substrate supporting the semiconductor layers, and wherein the wetting layer is arranged partially between the underfill material and the substrate of each pixel.

26. A pixelated light emitting diode (LED) chip comprising:
    an active layer comprising a plurality of active layer portions, wherein the plurality of active layer portions forms a plurality of pixels, wherein each pixel of the plurality of pixels includes electrical contacts, and inter-pixel spaces are provided between adjacent pixels of the plurality of pixels; an underfill material arranged in the inter-pixel spaces between the adjacent pixels; and
    a wetting layer between the underfill material and the plurality of active layer portions, wherein the wetting layer comprises a contact angle with the underfill material of less than about 30 degrees.

27. The pixelated-LED chip of claim 26, wherein the wetting layer comprises a contact angle with the underfill material in a range of about 22 degrees to about 30 degrees.

28. The pixelated-LED chip of claim 26, wherein the electrical contacts of each pixel comprise an anode and a cathode, and the wetting layer is further arranged between the anode and the cathode of each pixel of the plurality of pixels.

29. The pixelated-LED chip of claim 26, wherein the active layer portion of each pixel is peripherally bounded by a passivation layer, and the wetting layer is arranged to peripherally bound the passivation layer.

30. The pixelated-LED chip of claim 29, wherein the wetting layer is compositionally different from the passivation layer.

\* \* \* \* \*

UNITED STATES PATENT AND TRADEMARK OFFICE
CERTIFICATE OF CORRECTION

PATENT NO. : 10,903,265 B2  
APPLICATION NO. : 16/229986  
DATED : January 26, 2021  
INVENTOR(S) : Peter Scott Andrews and Steven Wuester Page 1 of 1

It is certified that error appears in the above-identified patent and that said Letters Patent is hereby corrected as shown below:

In the Specification

Column 13, Line 17, replace "(pm)" with --(μm)--.  
Column 19, Line 8, replace "60 82 m" with --60 μm--.

Signed and Sealed this  
Sixteenth Day of March, 2021

Drew Hirshfeld  
*Performing the Functions and Duties of the*  
*Under Secretary of Commerce for Intellectual Property and*  
*Director of the United States Patent and Trademark Office*